(12) United States Patent
Burroughs et al.

(10) Patent No.: US 6,558,219 B1
(45) Date of Patent: May 6, 2003

(54) METHOD OF MAKING ELECTROLUMINESCENT DEVICES HAVING VARYING ELECTRICAL AND/OR OPTICAL PROPERTIES

(75) Inventors: Jeremy Henley Burroughes, Cambridge (GB); Christopher John Bright, Huntingdon (GB); Karl Pichler, Wappingers Falls, NY (US); Peter Ho, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 151 days.

(21) Appl. No.: 09/656,227

(22) Filed: Sep. 6, 2000

Related U.S. Application Data

(63) Continuation of application No. PCT/GB99/00740, filed on Mar. 12, 1999.

(30) Foreign Application Priority Data

| Mar. 13, 1998 | (GB) | 9805478 |
| May 21, 1998 | (GB) | 9811014 |

(51) Int. Cl.[7] .......... H05B 33/10; H05B 33/14; B05D 5/06; B05D 5/12
(52) U.S. Cl. .......... 445/24; 445/23; 427/66; 313/504; 313/506
(58) Field of Search .......... 445/24; 427/66; 313/504, 506, 507; 428/690, 917

(56) References Cited

U.S. PATENT DOCUMENTS

| 4,539,507 A | 9/1985 | VanSlyke et al. ............ 313/504 |
| 5,156,918 A | 10/1992 | Marks et al. ................ 428/447 |
| 5,598,565 A | 1/1997 | Reinhardt ................... 395/750 |
| 5,601,903 A | 2/1997 | Fujii et al. ................. 428/212 |
| 5,766,515 A | 6/1998 | Jonas et al. ................. 252/500 |
| 5,821,690 A | * 10/1998 | Martens et al. ............. 313/506 |
| 6,083,635 A | 7/2000 | Jonas et al. ................. 428/690 |
| 6,235,414 B1 | * 5/2001 | Epstein et al. .............. 428/690 |

FOREIGN PATENT DOCUMENTS

| EP | 0 464 552 A2 | 1/1992 |
| EP | 0 686 662 A2 | 12/1995 |
| EP | 0 701 290 A1 | 3/1996 |
| EP | 0 707 301 A1 | 4/1996 |
| EP | 0 762 374 A1 | 3/1997 |
| EP | 0 901 176 A2 | 3/1999 |
| WO | WO 90/13148 | 11/1990 |
| WO | WO 97/48115 | 12/1997 |

OTHER PUBLICATIONS

Stockton et al., "Molecular–Level Processing of Conjugated Polymers. 4. Layer–by–Layer Manipulation of Polyaniline via Hydrogen–Bonding Interatctions," *Macromolecules*, 30:2717–2725 (1997).

Fou et al., "Interlayer Interactions in Self–Assembled Poly(Phenylene Vinylene) Multilayer Heterostructures, Implications For Light–Emitting and Photorectifying Diodes," *Mat. Res. Soc. Symp. Proc.*, 369:575–580 (1995).

(List continued on next page.)

Primary Examiner—Kenneth J. Ramsey
Assistant Examiner—Mack Haynes
(74) Attorney, Agent, or Firm—Marshall, Gerstein & Borun

(57) ABSTRACT

A method of forming an electroluminescent device, including the steps of forming a first charge carrier injecting layer for injecting charge carriers of a first polarity, forming an organic charge carrier transport layer over the first charge carrier injecting layer, the transport layer having an electronic and/or optical property which varies across the thickness of the transport layer, forming an organic light emissive layer over the transport layer, and forming a second charge carrier injecting layer over the light emissive layer for injecting charge carriers of a second polarity.

50 Claims, 20 Drawing Sheets

OTHER PUBLICATIONS

Wessling, "The Polymerization of Xylylene Bisdialkyl Sulfonium Salts," *J. Poly. Sci.: Poly. Symp.,* 72:55–66 (1985).

"Syntheses of Conducting Polymer Langmuir–Blodgett Multilayers", Ando et al., Thin Solid Films, 179, pp. 225–231 (1989).

"Electrical and Optical Properties of Polythiophene Prepared by Electrochemical Polymerization", Kaneto et al., Solid State Communications, vol. 46, No. 5, pp. 389–391 (1983).

"Buildup of Ultrathin Multilayer Films by a Self–Assembly Process: III. Consecutively Alternating Adsorption of Anionic and Cationic Polyelectrolytes on Charged Surfaces", Decher et al., Thin Solid Films, 210/211 pp. 831–835 (1992).

"Molecular–Level Processing of Conjugated Polymers. 2. Layer–by–layer Manipulation of In–Situ Polymerized p–Type Doped Conducting Polymers", Fou et al., Macromolecules 28, pp. 7115–7120 (1995).

"Efficient Photodiodes From Interpenetrating Polymer Networks", Halls et al., Nature, vol. 376, pp. 498–500 (1995).

"Fabrication and Properties of LIght–Emitting Diodes Based on Self–Assembled Multilayers of Poly(Phenylene Vinylene)", Fou et al., J. Appl. Phys. 79, pp. 7501–7509 (1996).

"Photophysics of Phenylenevinylene Polymers", Rothberg, et al., Synthetic Metals 80 pp. 41–58 (1996).

"Enhancement of Light Emitting Diodes Based on Self–Assembled Heterostructures of Poly(p–phenylene vinylene)", J. Appl. Phys. 80 (7), pp. 4067–4071 (1996).

"Singlet Intrachain Exciton Generation and Decay in Poly(p–phenylenevinylene)", Harrison et al., The American Physical Society, vol. 77, No. 9, pp. 1881–1884 (1996).

"Preparation of the Layer–by–Layer Deposited Ultrathin Film Based on the Charge–Transfer Interaction", Shimazaki et al., Langmuir 13, pp. 1385–1387 (1997).

"Langmuir–Blodgett Light–Emitting Diodes of Poly (3–hexylthiophene): Electro–Optical Characteristics Related to Structure", Östergård et al., Synthetic Metals 88, pp. 171–177 (1997).

* cited by examiner

METHOD OF MAKING ELECTROLUMINESCENT DEVICES HAVING VARYING ELECTRICAL AND/OR OPTICAL PROPERTIES

This is a continuation of International Application No. PCT/GB99/00740 filed Mar. 12, 1999, the entire disclosure of which is incorporated herein by reference.

This invention relates to electroluminescent devices, especially those that employ an organic material for light emission.

BACKGROUND OF THE INVENTION

Electroluminescent devices that employ an organic material for light emission are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene) ("PPV"), sandwiched between two electrodes. One of the electrodes (the cathode) injects negative charge carriers (electrons) and the other electrode (the anode) injects positive charge carriers (holes). The electrons and holes recombine in the organic layer generating photons. In PCT/WO90/13148 the organic light emissive material is a polymer. In U.S. Pat. No. 4,539,507 the organic light emissive material is of the class known as small molecule materials, such as tris-(8-hydroxyquinolino) aluminium ("Alq3"). In a practical device, one of the electrodes is typically transparent, to allow the photons to escape the device.

As a preliminary point, it should be noted that the values stated here for energy levels, workfunctions etc. are generally illustrative rather than absolute. The workfunction of ITO can vary widely. Numbers quoted in the literature suggest a range between 4 and 5.2 eV. The 4.8 eV value used here serves as an illustrative rather than an absolute value. The applicant has carried out Kelvin probe measurements which suggest that 4.8 eV is a reasonable value. However, it is well known that the actual value can depend on ITO deposition process and history. For organic semiconductors important characteristics are the binding energies, measured with respect to the vacuum level of the electronic energy levels, particularly the "highest occupied molecular orbital" ("HOMO") and "lowest unoccupied molecular orbital" ("LUMO") levels. These can be estimated from measurements of photoemission and particularly measurements of the electrochemical potentials for oxidation and reduction. It is well understood in the field that such energies are affected by a number of factors, such as the local environment near an interface, so the use of such values is indicative rather than quantitative.

These devices have great potential for displays. However, there are several significant problems. One is to make the device efficient, particularly as measured by its external power efficiency and its external quantum efficiency. Another is to optimise (e.g. to reduce) the voltage at which peak efficiency is obtained. Another is to stabilise the voltage characteristics of the device over time.

FIG. 1 shows a cross section of a typical device. FIG. 2 shows the energy levels across the device. The anode 1 is a layer of transparent indium-tin oxide ("ITO") with a workfunction of 4.8 eV. The cathode 2 is a Ca:Al layer (a calcium layer capped with aluminium) with a workfunction (for the calcium at the interface with the light emissive layer) of 2.9 eV. Between the electrodes is a light emissive layer 3 of poly (2,7-(9,9-di-n-octylfluorene) ("F8") doped with 5% poly-(2.7-(9,9di-n-octylfluorene)-3,6-benzothiadiazole) ("F8BT"), having a LUMO energy level 4 at around 2.8 eV and a HOMO energy level 5 at around 5.8 eV. (From now on the term "5BTF8" will be used to refer to this doped emissive layer blend). The emitter dopant LUMO and HOMO levels are around 3.4 and 5.8 eV respectively. FIG. 3 adopts a convention that the HOMO and LUMO energy levels for the dopant (F8BT) of the blend are shown by means of a rectangle inserted in the zone that corresponds to the major component (F8) of the blend. In this convention the width and lateral position of the rectangle has no particular meaning, and where a blend comprise three or more materials then two or more inserted rectangles are used. Holes and electrons that are injected into the device recombine radiatively in the 5BTF8 layer. An important feature of the device is the hole transport layer 6 of poly (styrenesulphonic acid) doped poly (ethylenedioxythiophene) ("PEDOT:PSS"). This provides an intermediate ionisation potential a little above 4.8 eV, which helps the holes injected from the ITO to reach the HOMO level in the F8. However, there is still a large barrier (approximately 1.0 eV) between the hole transport layer and the light emissive layer. The presence of high barriers is undesirable, for example because it may increase the drive voltage, build up high internal fields or cause accumulation of holes. One view is also that accumulation of charge at an interface is undesirable because it can promote chemical reactions between the polymer and contaminants, leading to conjugation reduction or deep localised states that may then be charged by the accumulation layer. The charge "trapping" is believed to result in higher bias being required to pass the same current through the device, leading to a relatively rapid voltage increase with time, as the device is used.

It is well-known to use oxygen plasma treatment to clean substrates, and especially to remove organic material. It is also well known that such plasma treatment of ITO can be used to modify the ITO's work function and potentially reduce the hole injection barrier. (See, for example, WO 97/48115).

Processes have been described for the formation of ultrathin films with to layer-by-layer control. For example, W. B. Stockton and M. F. Rubner, "Molecular-level processing of conjugated polymers. 4. Layer-by-layer manipulation of polyaniline via hydrogen-bonding interactions," Macromolecules, Vol. 30, pp. 2717–2725, 1997 describes polymer self-assembly via hydrogen bonding interactions; Y. Shimazaki, M. Mitsuishi, S. Ito and M. Yamamoto, "Preparation of the layer-by-layer deposited ultrathin film based on the charge-transfer interaction," Langmuir, Vol. 13, pp. 1385–1387, 1997 describes polymer self-assembly via charge-transfer interactions; A. C. Fou and M. F. Rubner, "Molecular-level processing of conjugated polymers. 2. Layer-by-layer manipulation of in-situ polymerized p-type doped conducting polymers," Macromolecules, Vol. 28, pp. 7115–7120, 1995 describes a process for ultra-thin film formation by active in-situ polymerization; M. Ando, Y. Watanabe, T. Iyoda, K Honda and T Shimidzu, "Synthesis of conducting polymer Langmuir-Blodgett multilayers," Thin Solid Films, Vol. 179, pp. 225–231, 1989 describes a Langmuir-Blodgett deposition process; and K. Kaneto, K. Yoshino and Y. Inuishi, "Electrical and optical properties of polythiophene prepared by electrochemical polymerization," Solid State Communications, Vol. 46, pp. 389–391, 1983 describe electrochemical polymerization on conducting substrates. None of these documents describes gradation of charge transport layers for light emissive devices.

Further details of the manufacture of self-assembled polymer interlayers are given in our co-pending PCT patent application number PCT/GB98/02671, the entire contents of which are incorporated herein by reference. It will be apparent that the techniques described in this application can be combined in various ways with those in that prior application.

SUMMARY OF THE INVENTION

According to a first aspect of the present invention there is provided a method of forming an electroluminescent device, comprising: forming a first charge carrier injecting layer for injecting charge carriers of a first polarity; forming an organic charge carrier transport layer over the first charge carrier injecting layer, the transport layer having an electrical and/or optical property which varies across the thickness of the transport layer; forming an organic light emissive layer over the transport layer; and forming a second charge carrier injecting layer over the light emissive layer for injecting charge carriers of a second polarity.

The step of forming a transport layer suitably comprises steps of first depositing the transport layer and then processing the transport layer to create the variation in the electronic and/or optical property(ies) across the thickness of the transport layer. An alternative is to deposit the transport layer in such a way that it has the required properties when deposited, for example by using self-assembly or other deposition techniques. Examples of other layer-by-layer polymer deposition techniques include polymer self-assembly by electrostatic, hydrogen-bonding or donor-acceptor interactions, Langmuir-Blodgett assembly methods, and in-situ polymerisation electrochemical preparation techniques. If small molecule materials were used instead of polymers then small molecule self-assembly reactions that lead to the formation of stratified structures could be used.

Examples of the said electronic and optical property(ies) include one or more energy levels and/or energy level distributions, which are suitably responsible for transport of charge carriers such as holes or electrons. In the case of holes these may (for instance) be a HOMO level, a valence band, an ionisation potential an acceptor doping level or trap or other states close to (e.g.) an ionisation potential. In the case of electrons these may (for instance) be a LUMO level, a conduction band, an electron affinity, donor states or trap or other states close to (e.g.) an electron affinity. Other such properties are the bandgap or optical gap. One or more of these properties may vary across the thickness of the transport layer. The energy level may be for accepting charge carriers of the first polarity or for accepting charge carriers of the second polarity.

The charge carriers of a first polarity are suitably positive charge carriers, in which case the transport layer is a positive charge carrier transport layer.

According to a second aspect of the present invention there is provided a method of forming an electroluminescent device, comprising: forming a first charge carrier injecting layer for injecting positive charge carriers; forming an organic light emissive layer over the transport layer, an electrical and/or electronic property of the light emissive layer varying across the thickness of the emissive layer; and forming a second charge carrier injecting layer over the light emissive layer for injecting negative charge carriers. The said property is suitably of the types set out in detail above.

The step of forming a light emissive layer suitably comprises steps of first depositing the emissive layer and then processing the emissive layer to create the variation in the said property (e.g. its ionisation potential or band gap) across its thickness.

The step of processing or modifying the emissive layer or, in the first aspect of the invention, the transport layer, preferably comprises exposing the emissive or transport layer to an agent that causes modification of the electronic characteristics of the layer. One possibility is that the agent could be a reactive agent, which suitably promotes a chemical reaction in the transport layer. Preferably the conditions of the reaction are such that the degree of reaction varies through the emissive or transport layer so as to provide the variation in the ionisation potential. Preferably one major surface of the emissive or transport layer is exposed to the agent.

The reaction may suitably be an oxidation reaction or a reduction reaction (which could cause de-doping), especially in the case of the transport layer. The agent may be an oxidising agent, for example oxygen. The agent is suitably in the form of a plasma. One preferred reactive oxidising agent is an oxygen plasma. The degree of oxidation, reduction or dedoping preferably varies through the thickness of the transport layer or the emissive layer, suitably leading to the variation in the electronic/optical properties. The plasma preferably also comprises an inert gas, suitably for cooling purposes The emissive or transport layer suitably comprises a conjugated material. Then, the step of creating the variation in the electronic/optical property(ies) preferably comprises reducing the degree of conjugation of the conjugated material.

The electronic/optical property(ies) preferably varies continuously or substantially continuously through the emissive or transport layer. In the first aspect of the invention, in a direction from the first charge carrier injecting layer to the light emissive layer the ionisation potential preferably varies away from the conduction band (Fermi level) of the first charge carrier injecting layer towards the appropriate HOMO or LUMO level of the light emissive layer. In the second aspect of the invention the optical gap of the light emissive layer preferably changes (most preferably widens) in a direction from the first charge carrier injecting layer to the second charge carrier injecting layer.

According to a third aspect of the present invention there is provided an electroluminescent device comprising: a first charge carrier injecting layer for injecting positive charge carriers; a second charge carrier injecting layer for injecting negative charge carriers; an organic light emissive layer located between the charge carrier injecting layers; and an organic charge carrier transport layer located between the light emissive layer and one of the charge carrier injecting layers, and comprising an organic material having an energy level for accepting positive charge carriers from the said one of the charge carrier injecting layers which varies across the thickness of the transport layer.

The said energy level for accepting positive charge carriers from the said one of the charge carrier injecting layers may be replaced or supplemented by an organic charge carrier transport layer located between the light emissive layer and the other of the charge carrier injecting layers, and comprising an organic material having an energy level for accepting negative charge carriers from the said other of the charge carrier injecting layers which varies across the thickness of the transport layer.

According to a fourth aspect of the present invention there is, provided an electroluminescent device comprising: a first charge carrier injecting layer for injecting positive charge carriers; a second charge carrier injecting layer for injecting negative charge carriers; and an organic light emissive layer located between the charge carrier injecting layers, the optical gap of the light emissive layer varying across the thickness of the emissive layer According to a fifth aspect of the present invention there is provided a method of forming an electroluminescent device comprising a first charge carrier injecting layer for injecting charge carriers of a first polarity, a second charge carrier injecting layer for injecting charge carriers of a second polarity and at least one organic layer located between the charge carrier injecting layers, the method comprising at least partially oxidising or reducing the organic layer. Oxidation may, for example, be by exposure to a reactive oxidising agent such as an oxygen plasma or by photooxidation. Reduction may, for example, be by exposure to a reactive reducing agent. Suitably a major surface of the transport layer or the light emissive layer is exposed to the reactive oxidising or reducing agent or the light used for photo-oxidation.

According to a sixth aspect of the present invention there is provided a method of forming a layer comprising an organic compound, the layer having at least one property that varies across its thickness, the method comprising forming a series of sub-layers, differing in that property. The property is preferably a material property such as ionisation potential, electron affinity or bandgap or in general an electrical and/or optical property as set out in more detail above. The compound may be a polymer, an otigomer or a small molecular compound. A polymer is preferred. The sub-layers may be deposited with the said differing properties or may be deposited and then modified to gain the said properties. The sub-layers are preferably deposited by a self-assembly-type method, e.g. using Langmuir-Blodgett techniques or self-assembly techniques that make use of electrostatic, hydrogen and/or covalent bonding effects. Another route may be to use blends of materials that on deposition phase-separate into, multilayers, e.g. bilayers. A preferred route is a polyelectrolyte self-assembly method in which the sub-layers are constituted in the form of bilayers. The layer may be a charge transport layer. The layer may form part of an electronic device, such as a light emitting device, preferably a light emitting device that uses an organic material for light emission.

Some preferred materials for all aspects of the present invention are as follows:

One of the charge carrier injecting layers (the hole injecting layer) preferably has a work function of greater than 4.3 eV. That layer may comprise ITO. The other charge carrier injecting layer (the electron injecting layer) preferably has a work function less than 3.5 eV. That layer may suitably comprise calcium, lithium, samarium, ytterbium, terbium, barium or an alloy comprising one or more of those metals with or without another metal such as aluminium. At least one of the electrode layers is suitably light transmissive, and preferably transparent, suitably at the frequency of light emission from the device.

The transport layer may suitably comprise one or more polymers such as poly(styrenesulphonic acid) doped poly(ethylenedioxythiophene) and/or poly(2,7-(9,9-di-n-octylfluorene)-(1,4-phenylene-(4-imino(benzoic acid))-1,4-phenylene-(4-imino(benzoic acid))-1,4-phenylene)) ("BFA") (see FIG. 3) and/or polyaniline (doped, undoped or partially doped) and/or PPV.

The light emissive layer may comprise one or more organic materials, suitably polymers, preferably conjugated or partially conjugated polymers. Suitable materials include PPV, poly(2-methoxy-5-(2'-ethyl) hexyloxyphenylene-vinylene) ("MEH-PPV"), a PPV-derivative (e.g. a di-alkoxy or di-alkyl derivative), a polyfluorene and/or a co-polymer incorporating polyfluorene segments, PPVs and/or related co-polymers, poly (2,7-(9,9-di-n-octylfluorene)-(1,4-phenylene-((4-secbutylphenyl)imino)-1,4-phenylene)) ("TFB") (see FIG. 3), poly(2,7-(9,9-di-n-octylfluorene)-(1,4-phenylene-((4-methylphenyl)imino)-1,4-phenylene-((4-methylphenyl)imino)-1,4-phenylene)) ("PFM") (see FIG. 3), poly(2,7-(9,9-di-n-octylfluorene)-(1, 4phenylene-((4-methoxyphenyl)imino)-1,4-phenylene-((4-methoxyphenyl)imino)-1,4-phenylene)) ("PFMO") (see FIG. 3), F8 or F8BT. Alternative materials include organic molecular light-emitting materials, e.g. Alq3, or any other small sublimed or solution processed molecule or conjugated polymer electroluminescent material as known in the prior art. Other materials could be used.

The effect of the variation in the electrical or optical properties (e.g. energy level or energy level distribution) of the transport layer and/or the step of modifying the transport layer by (for example) oxidation is suitably to improve transport of the charge carriers of one polarity between the electrode and the emissive layer and/or to impede the transport of charge carriers of the other polarity between the emissive layer and the electrode, and thereby improve the efficiency of the device. It is preferred that at least one energy level of the transport layer is such as to provide a barrier to and/or inhibit passage of charge carriers of one polarity through the device, for example by inhibiting passage of such charge carriers across the interface from the emissive layer; in contrast, passage of charge carriers of the other polarity across that interface is preferably favoured.

BRIEF DESCRIPTION OF THE DRAWINGS

The present invention will now be described by way of example with reference to the accompanying drawings, in which.

DETAILED DESCRIPTION OF THE DRAWINGS

Figure 1:
FIG. 1 shows a cross section of a typical prior art electroluminescent device.
Figure 2:
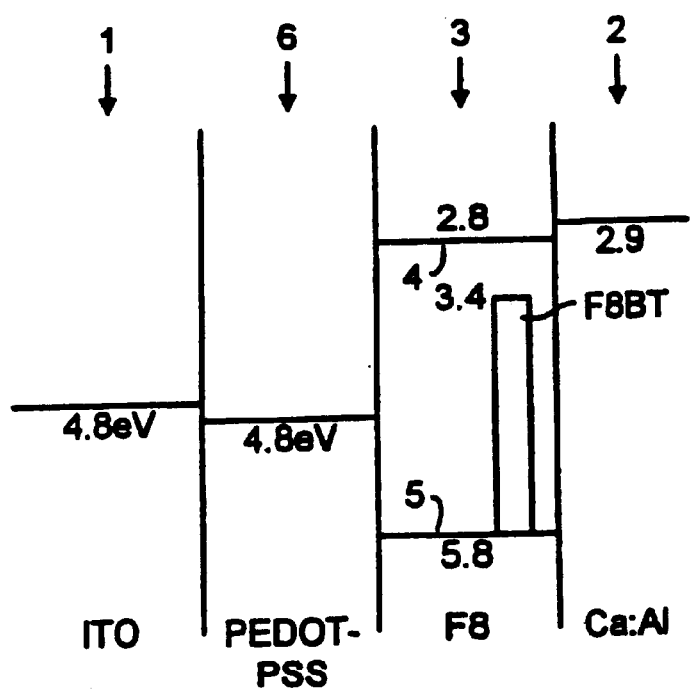
FIG. 2 shows the energy levels across the prior art electroluminescent device of FIG. 1.
Figure 4A:
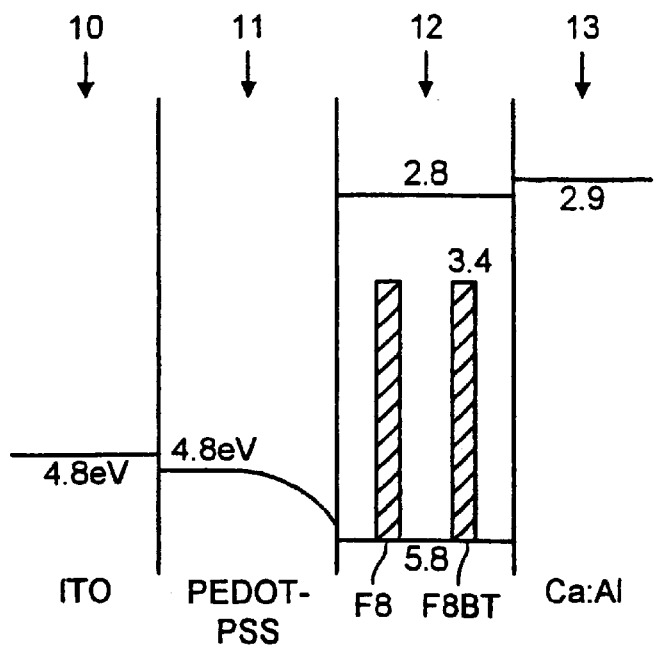
FIGS. 4a and 4b are a schematic band diagrams for electroluminescent devices.

FIG. 4a shows a schematic band diagram for an electroluminescent device whose physical structure is similar to that shown in FIG. 1. The device comprises an anode layer 10 of ITO on a glass substrate. Over the ITO is a hole transport layer 11 of PEDOT:PSS. Over the hole transport layer is a light emissive layer 12 comprising a mixture of F8 and F8BT. Over the light emissive layer is a cathode layer 13 of Ca:Al. The energy level(s) responsible for the positive charge carrier transport in the PEDOT:PSS are not constant through the thickness of the hole transport layer 11. It/they range(s) from the untreated PEDOT:PSS level of 4.8 eV near the interface with the anode 10 to possibly up to 6.0 eV at the interface with the light emissive layer 12. The applicant has found that this treatment improves the performance of the device dramatically.

The manufacture of this device will now be described.

The glass substrate is a polished glass sheet of sodalime glass 1.1 mm thick, with a barrier layer of silicon dioxide around 100 nm thick on its upper surface. The ITO anode is deposited on to the silicon dioxide by a conventional DC or RF sputtering technique. The completed ITO layer is about 1500 Å thick with a sheet resistance of around 15 Ohm/square and a transparency of about 85%. Alternatives to ITO are other conductive materials such as fluorinedoped tin-oxide, aluminiumdoped zinc-oxide, metals such as gold, alloys and conductive polymers such as doped polythiophenes (e.g. PEDOT;PSS) or doped polyaniline, or combinations-thereof. To provide an effective anode the material is preferably a high work function material, with a work function higher than, say, 4.0 or 4.5eV. In devices where the emitted light is to be transmitted through the anode, the anode should be at least partially transparent or light transmissive.

At this stage the ITO layer can, if necessary, be patterned, for example by conventional wet-chemical ITO patterning techniques, and then cleaned.

The PEDOT:PSS layer 11 is a conductive conjugated polymer layer. The PEDOT:PSS mixture as supplied (see EP 0 686 662 and Bayer AG's Provisional Product Information Sheet for Trial Product Al 4071) is diluted further with PSS to achieve a solid content ratio of PEDOT to PSS of 1:2 and a total solid content of 1%. The mixture is deposited on to the ITO layer by spin coating and then dried by heating—for instance at 110° C. or 200° C. in air or flowing nitrogen of purity 99.999%. Then the PEDOT:PSS layer is exposed to a reactive agent, more details of which are given below. The thickness of the completed PEDT/PSS layer is around 50 nm.

To prepare the emissive layer the parent polymers of F8 and F8BT are mixed (the ratio of F8 to F8BT is 0.95:0.05 wt/wt) and the resulting mixture is then spin-coated over the PEDOT:PSS layer from a 1.6 w/v % concentration solution with mixed xylene as the solvent. The thickness of the completed emissive layer is around 95 nm. Table 1 gives material properties of the conjugated organic polymer materials F8 and F8BT. The photoluminescence efficiencies were measured using the technique of "Efficient Photodiodes from Interpenetrating Polymer Networks", J J M Halls et al., Nature, Vol. 376, Aug. 10, 1995, pp498–500 and U.S. Pat. No. 5,670,791. The HOMO positions were estimated from electrochemical measurements. The optical gaps were determined from the UV/visible absorbance spectrum. The LUMO positions were estimated from the HOMO position and the optical gap.

TABLE 1

| Material | Photoluminescence Efficiency (%) | HOMO Level (eV) | LUMO Level (eV) | Optical gap (eV) | Emission Colour |
|---|---|---|---|---|---|
| F8 | 80 | 5.8 | 2.8 | 3.0 | Blue |
| F8BT | 95 | 5.9 | 3.5 | 2.4 | Green |

Finally the cathode is deposited by evaporation to form a 80 nm thick layer of Ca, followed by a 200 nm layer of Al. In an inert atmosphere such as nitrogen the device is encapsulated by sealing within a glass/epoxy encapsulant.

Figure 4B:
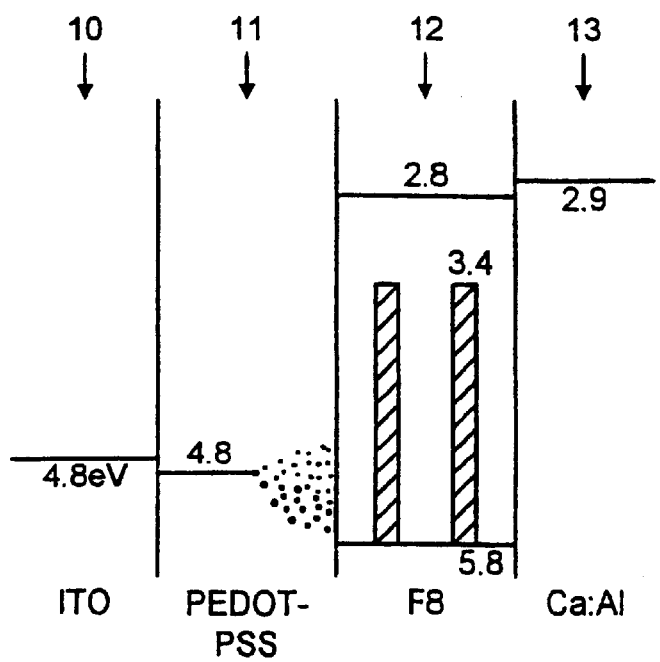
Figure 5:
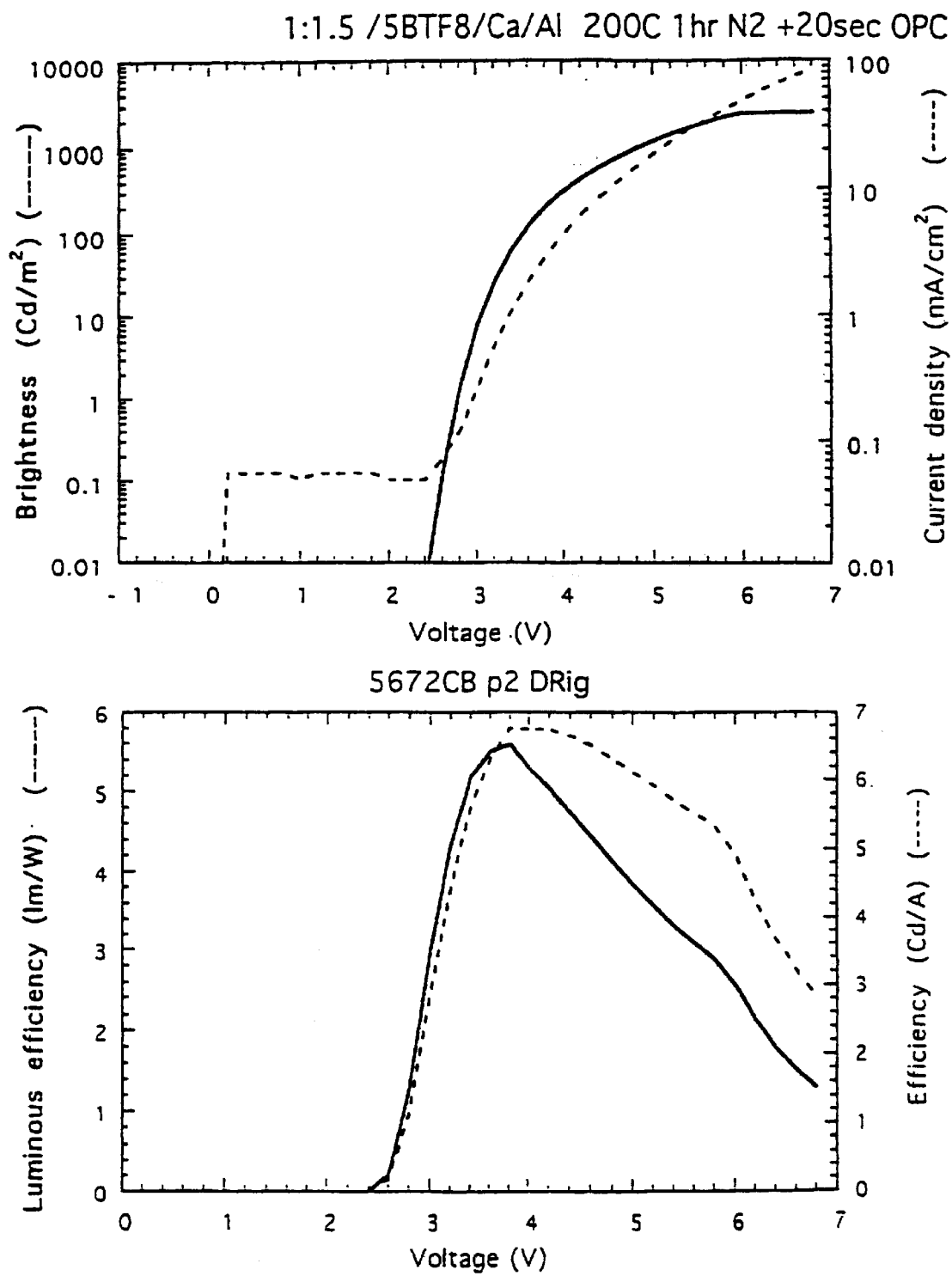
FIGS. 5 to 9 are graphs plotting the performance of electroluminescent devices.
Figure 6:
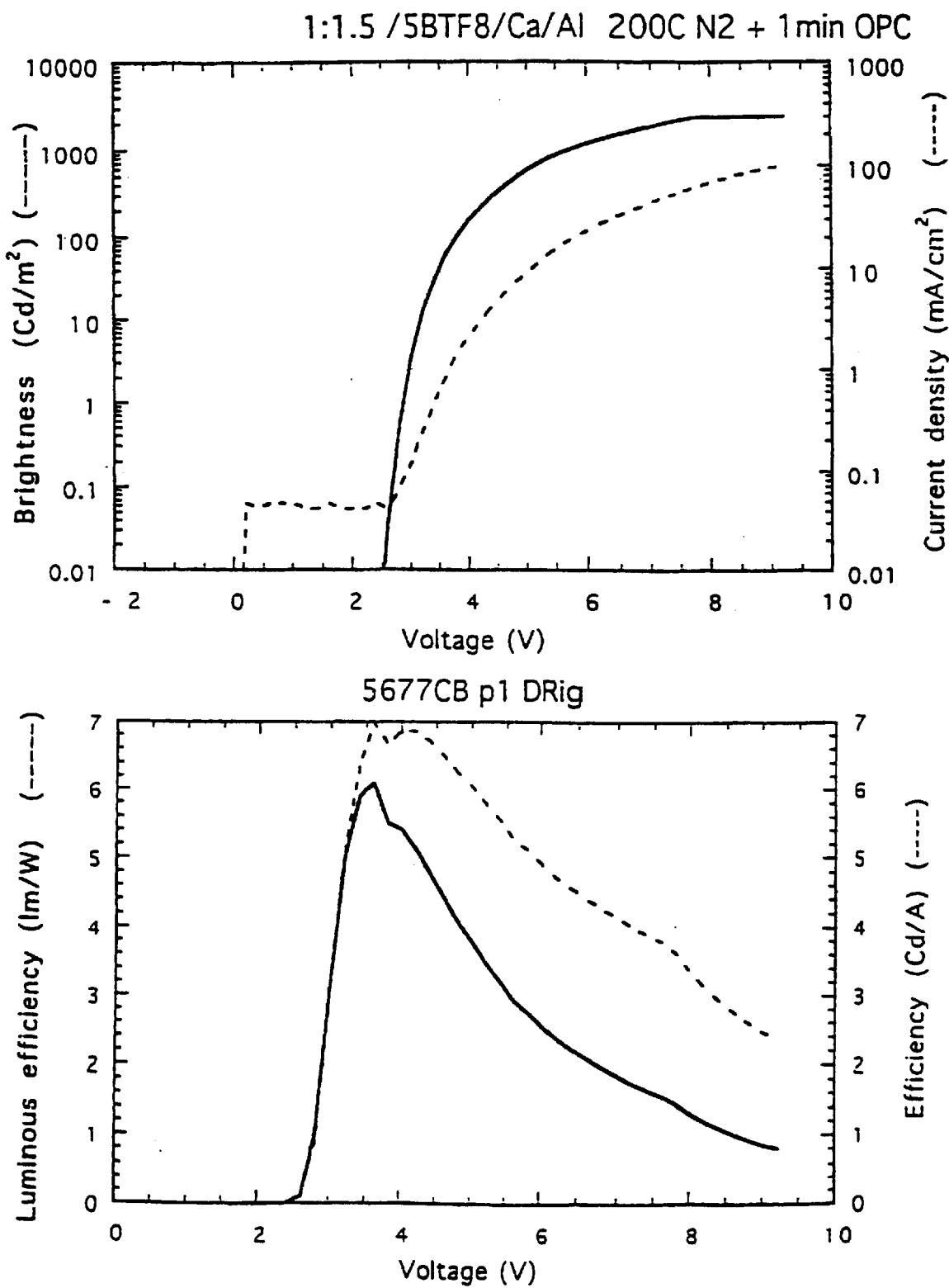
Figure 7:
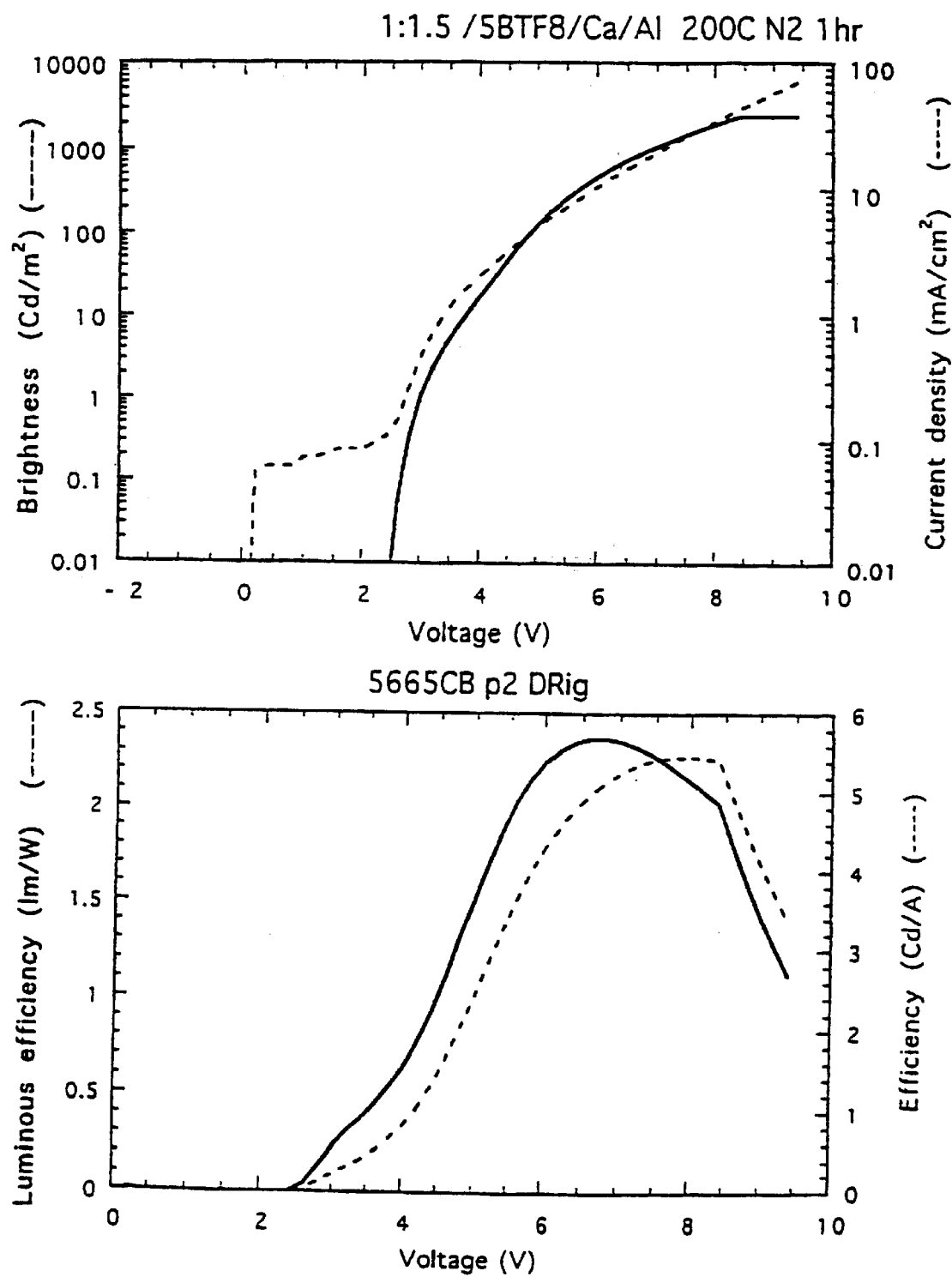
Figure 8:
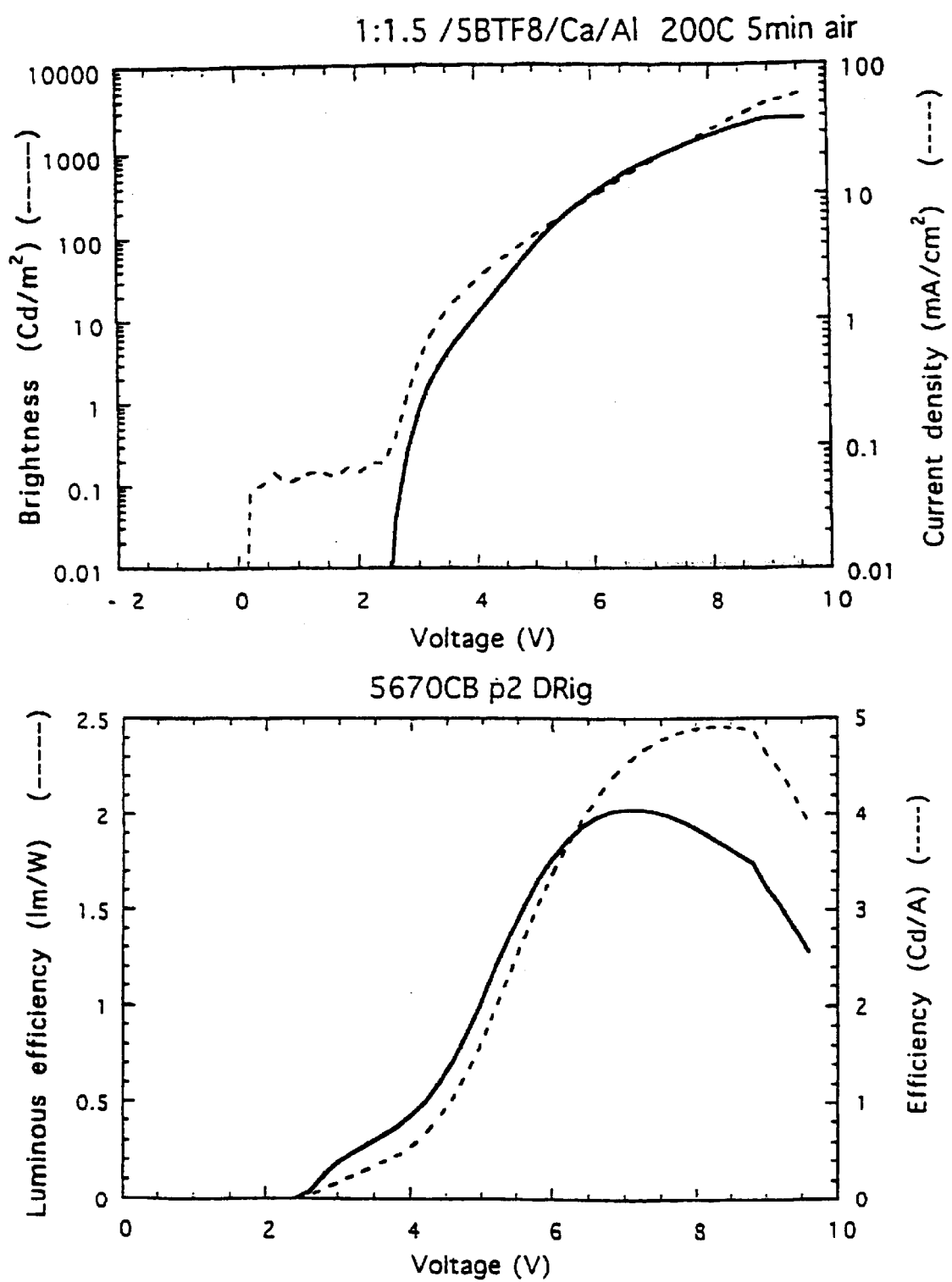

The reactive treatment of the PEDOT:PSS layer will now be described. After the PEDOT:PSS layer has been deposited and dried it is exposed to reactive oxygen in the form of an oxygen plasma. The oxygen plasma is generated by a standard commercial microwave multimode plasma reactor such as a Cambridge Fluid Systems MRC100 (2.45 GHz) under the following process conditions:

chamber pressure: 2 mbar argon flow: 5 l/min oxygen flow: 2 l/min power: 0.044 W/cm$^2$ ion density: $10^{12}$/cm$^2$ electron temp.: 1–2 eV ion flux: $4\times10^{15}$–$4\times10^{16}$ ion/cm$^2$/sec Argon is added to the plasma to cool the substrate. It is the major surface of the PEDOT:PSS that is to form the interface with the emissive layer that is principally exposed to the plasma. Therefore, the oxidising effect of the plasma is greatest at that surface and decreases with depth into the PEDOT:PSS layer as the penetration of excited oxygen is likely to be shallow and will depend on ion energy. The plasma is applied to the device for sufficient time that the PEDOT:PSS does not react fully with the oxygen, at least at deeper parts of the layer (i.e. those closer to the ITO). It is believed that this may produce the effect shown in FIG. 4a, where the energy level of the PEDOT:PSS varies smoothly and continuously through the-thickness of the layer when the device is not under external bias, from its normal level near the interface with the anode to a reduced level closer to the HOMO level of the emissive layer near the interface with the emissive layer. An alternative interpretation is illustrated in FIG. 4b, which shows a broad distribution of extra trapped states near the interface of the PEDOT with the emissive layer.

Using a plasma source where the ion energy can be controlled (e.g. via a bias voltage), the ion flux monitored and the ratio of ions to radicals selected makes it easier to select the shape and extent of the transition region from the normal doped PEDOT workfunction ($W_f$) to the surface workfunction ($W_f^s$). The transition region can be controlled so that the effective surface workfunction can be tuned approximately to the HOMO position of the emissive polymer. Further, if essentially a thin barrier layer was required, then modifying the plasma so that only radicals impinged the surface could have the desired effect of forming a thin highly non-conjugated polymer layer.

Devices A to D were prepared, with different treatments being applied to the PEDOT:PSS layers.

For device A the PEDOT:PSS layer was cured in an oven for 1 hour in a $N_2$ atmosphere at 200° C. and then exposed to oxygen plasma for 20 seconds. For device B the PEDOT:PSS layer was cured in an oven for 1 hour in a $N_2$ atmosphere at 200° C. and then exposed to oxygen plasma for 1 minute. Devices C and D were prepared as controls. For device C the PEDOT:PSS layer was cured in an oven for 1 hour in a $N_2$ atmosphere at 200° C. and not exposed to plasma. For device D the PEDOT:PSS layer was cured on a hot plate for 1 hour in air, with the hot plate at a temperature of 200° C., and not exposed to plasma.

FIGS. 5 to 9 compare the performance of these devices. FIGS. 5 to 8 show the characteristics of devices A to D respectively. The top panel of each figure shows the brightness of the device against applied voltage and the current density through the device against applied voltage. The bottom panel of each figure shows the luminous efficiency (power efficiency) in lumens/Watt of the device against applied voltage and external efficiency of the device in Candela/Amp against applied voltage.

The following table summarises the performance of the devices from the data of FIGS. 5 to 8.

TABLE 2

| Device | Peak power efficiency (lm/W) | Voltage at peak power efficiency (V) | Peak external efficiency (Cd/A) | Voltage at peak external efficiency (V) |
| --- | --- | --- | --- | --- |
| A | 5.6 | 3.8 | 6.7 | 3.8 |
| B | 6.1 | 3.6 | 7.0 | 3.6 |
| C | 2.4 | 6.8 | 5.5 | 8 |
| D | 2.0 | 7.0 | 4.9 | 8.4 |

The step of exposure of the PEDOT:PSS layer to oxygen plasma causes roughly a three-old increase in the peak power efficiency (1 m/W) and a significant increase in peak external efficiency (Cd/A). The voltages at which peak efficiencies are obtained are roughly halved.

Figure 9:
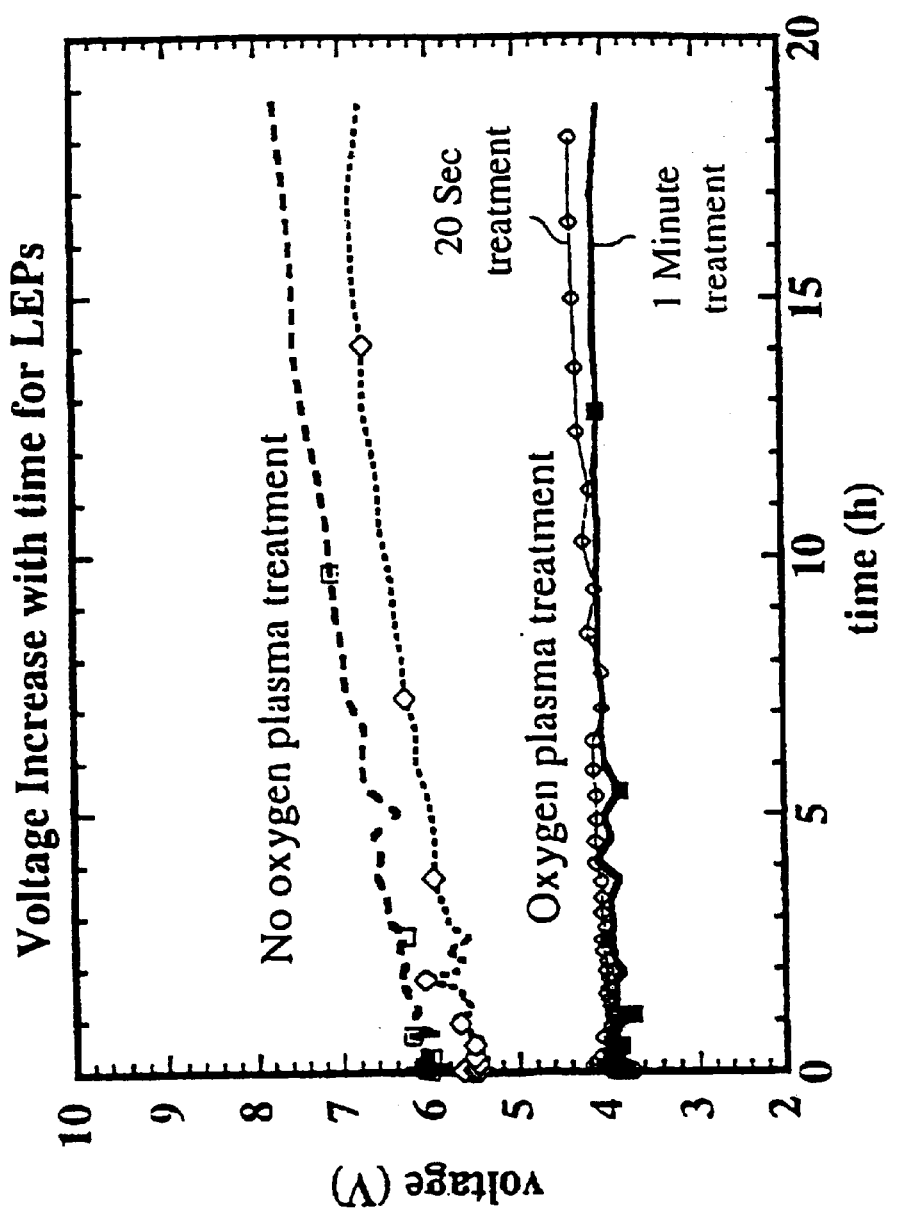

FIG. 9 shows that exposure of the PEDOT:PSS layer to oxygen plasma also appears to stabilise the voltage characteristics of the device significantly for an initial light output of 200 Cd/m². (Device in constant current drive).

One possible mechanism for the effect of the oxygen plasma on the PEDOT:PSS is oxidation of the PEDOT:PSS layer, possibly by ring opening and/or production of carbonyl groups which reduce conjugation in the PEDOT and widen its band gap (see Rothberg et al., "Photophysics of phenylenevinylene polymers", Synthetic Metals 80 (1996) 41–58). Another possible mechanism is that the oxygen plasma could de-dope the PEDOT, and thus possibly increase its work function. In either case, it would appear that the HOMO level of the PEDOT:PSS may be varied to be closer to that of the emissive layer near the interface between the two, as shown in FIG. 4a. Assuming that a key factor in the increase in drive voltage is the presence of significant internal barriers and hence possibly voltage drops and/or charge accumulation, the reduced voltage increase with time suggests that the HOMO level transition from the doped value of 4.8 eV to the surface value may be essentially gradual through the thickness of the PEDOT:PSS layer.

Figure 10:
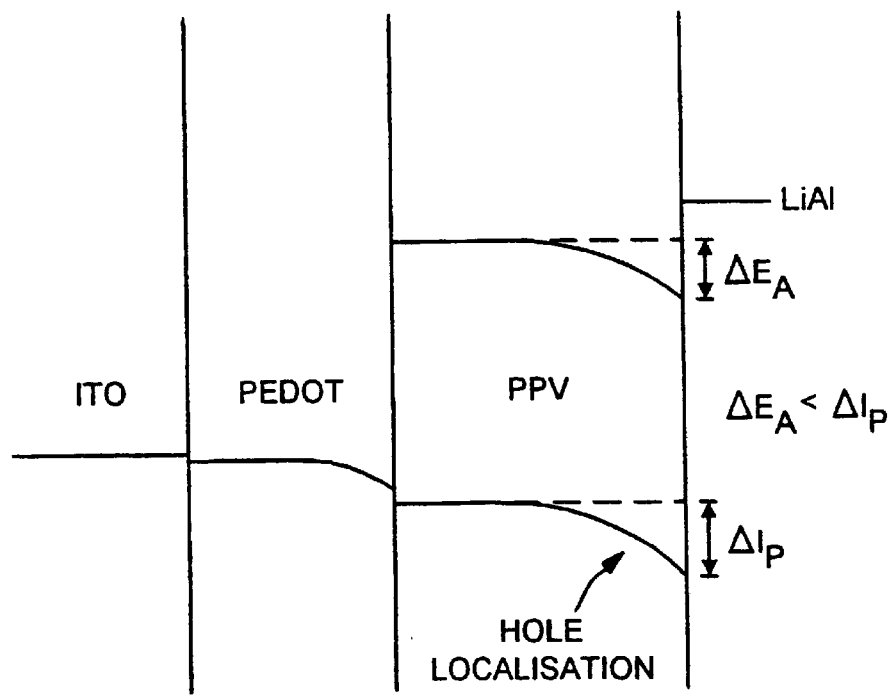
FIG. 10 illustrates the effect of plasma on an emissive layer adjacent to a cathode.
Figure 11:
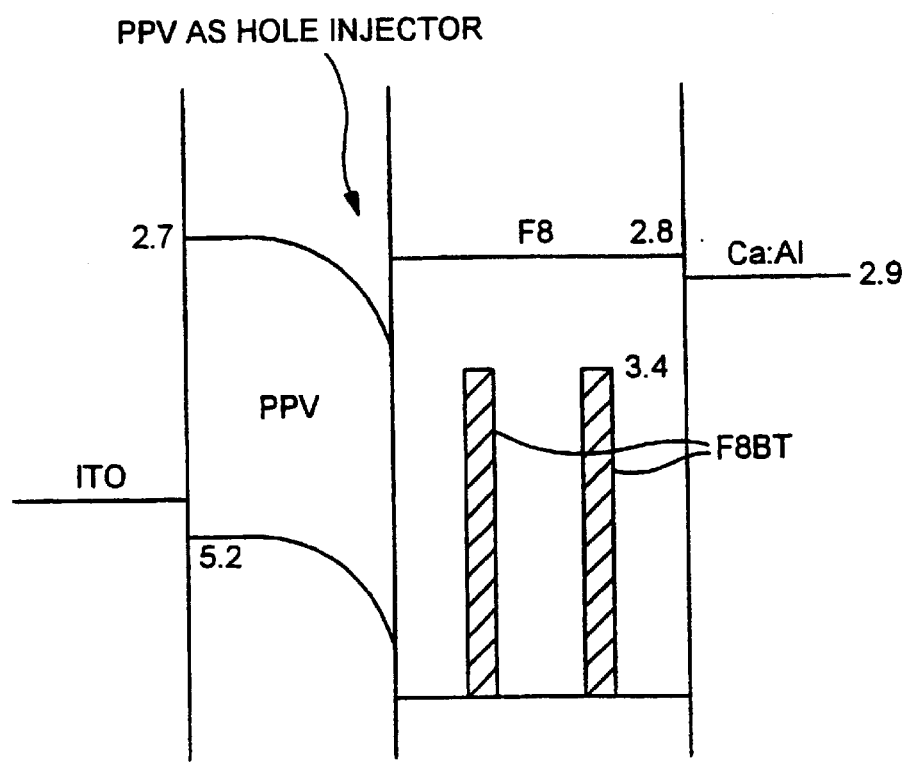
FIG. 11 illustrates a device in which photo-oxidation alters the electronic characteristics of a PPV hole transport layer.

A similar technique may be used to widen the bandgap of material forming a light emissive layer. (See FIG. 10). By exposing a light emissive layer, after it has been deposited, to (for example) oxygen plasma the HOMO layer of the emissive material (e.g. PPV) may be reduced near its surface that is to form the interface with the cathode. This may inhibit passage of holes from the emissive material to the cathode, increasing the efficiency of the device. Another option is to photo-oxidise the PPV to create carbonyl groups (see Rothberg et al., referred to above, and Harrison at al., "Singlet Intrachain Exciton Generation and Decay in Poly (p-phenylenevinylene", Physical Review Letters, Vol. 77, No. 9, pp 1881–4, Aug. 22, 1996). With above optical-gap enhanced photo-oxidation, the wavelength and/or angle of incidence of the light used for the oxidation step may be chosen for absorption depth to achieve the desired depth profile of ionisation potential, because the process may not be limited by the oxygen diffusion rate. However, the best wavelength may be near to the peak in optical absorption of the layer (blue for PPV). Chain scission on photo-oxidation of PPV could force a greater change in $I_p$ than in $E_A$, widening the optical gap of the PPV. (See FIG. 11, which illustrates the case where PPV is used as a hole injection layer and 5BTF8 is the emitting layer).

Alternative materials could be used in devices that embody the principles described above. For example, alternative materials for the anode include tin oxide ("TO") and fluorinated TO; alternative materials for the emissive layer include TFB, PFMO, PFM, PPV and MEH-PPV; and alternative materials for the cathode include Li, Ba, Mg, Ca, Ce, Cs, Eu, Rb, K, Sm, Na, Sm, Sr, Tb and Yb; an alloy of two or more of such metals; a fluoride, carbide, oxide or nitride of one or more of such metals (e.g. CsF, LiF); and an alloy of one or more of such metals together with one or more metals such as Al, Zr, Si, Sb, Sn, Zn, Mn, Ti, Cu, Co, W, Pb, In or Ag (e.g. LiAl). The cathode could be transparent. The hole transport layer could be omitted, or there could be more than one hole transport layer. There could be one or more electron transport layers between the cathode and the emissive layer, which would act to facilitate transfer of electrons from the cathode to the emissive layer and/or to block passage of holes to the cathode.

Instead of PEDOT:PSS the hole transport layer could comprise BFA or polyaniline. The hole transport layer could be a mixture of materials. For instance, it could be of BFA blended with a suitably solubilised PFM-like polymer.

Other agents could be used, and oxidising agents are just examples. Options include exposure to hydrogen peroxide, ozone (in the form of a gas or contained in solution), other bleach solutions and other gases such as $H_2$, $HCF_3$ and other chlorine- and/or fluorine-containing gases such as $CF_4$ or $CCl_4$. Treatments that reduce the effect of PSS on PEDOT, such as ammonia, could also be considered.

It is believed that another consequence of the surface treatment of a layer may be observed in devices in which a subsequent layer of material comprising a mixture of components is deposited over the treated surface. The treatment of the surface may alter the treated layer's surface characteristics, for example its surface free energy or the structural features of the surface. This alteration may affect the affinity of components of the subsequently deposited mixture for the surface, with the result that during or after deposition of those components on to the surface one or more of the components may be selectively attracted to or repelled from the surface in comparison to one or more others of the components. Thus the surface treatment may be used to influence the distribution of the components in the subsequent layer. It may be generally desirable to use this effect to cause a relative attraction to the treated surface of one or more components of the mixture that are intended, in the finished device, directly to interact electronically with the layer whose surface is treated. An example of this effect could be employed in a device in which a light-emissive layer comprising a mixture of components is deposited over a layer of PEDOT. If the PEDOT is to act as a hole transport layer in the completed device then it may be advantageous to increase the concentration of a hole accepting component of the mixture in the region of the light-emissive layer near the PEDOT layer. Since the components of the mixture are likely to have different surface interactions, in many cases it would be expected that modification of the surface of the PEDOT layer (e.g. by increasing or decreasing its surface free energy) will encourage a desired one of the components to be preferentially attracted to the PEDOT surface if the emissive layer is deposited over the PEDOT layer. Similarly, if the emissive layer is deposited over a layer of another material (which need not be intended to be a hole transport material and could, for example, be intended to be an electron transport material) the same effect could be employed to attract a desired component of the emissive material to that layer. The effect could also be employed to influence the distribution of components in non-emissive layers such as composite hole and/or electron transport layers. Available treatments for generating this effect include plasma treatment and other oxidation treatments and solvent treatment.

Another method for grading the properties of the PEDOT layer through its thickness will now be described.

Figure 3:
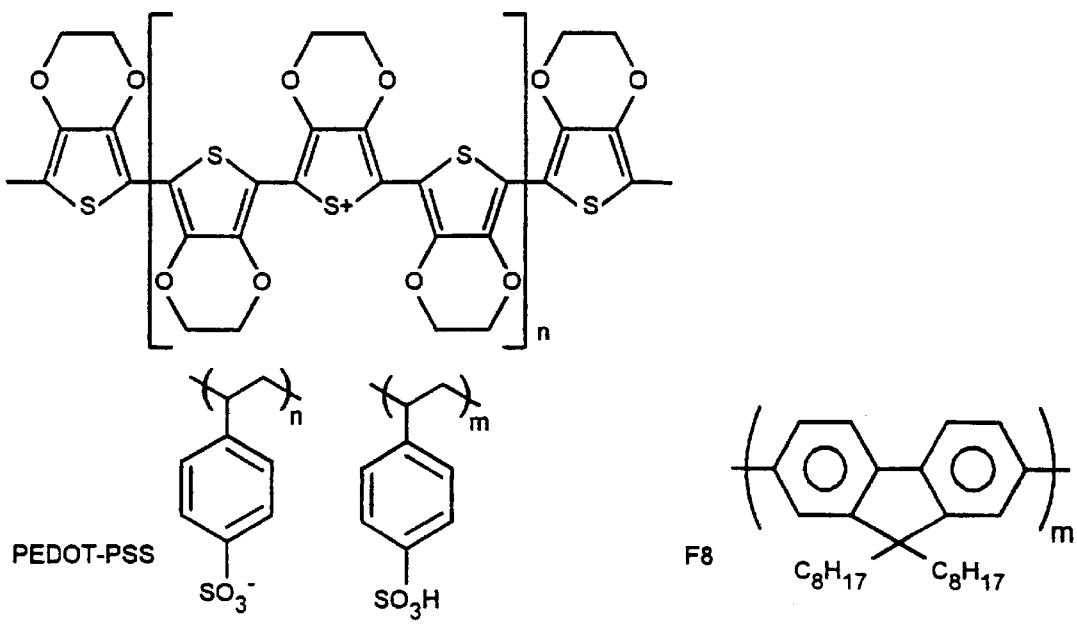
FIG. 3 shows the chemical structures of PEDOT:PSS, F8 and F8BT.
Figure 3:
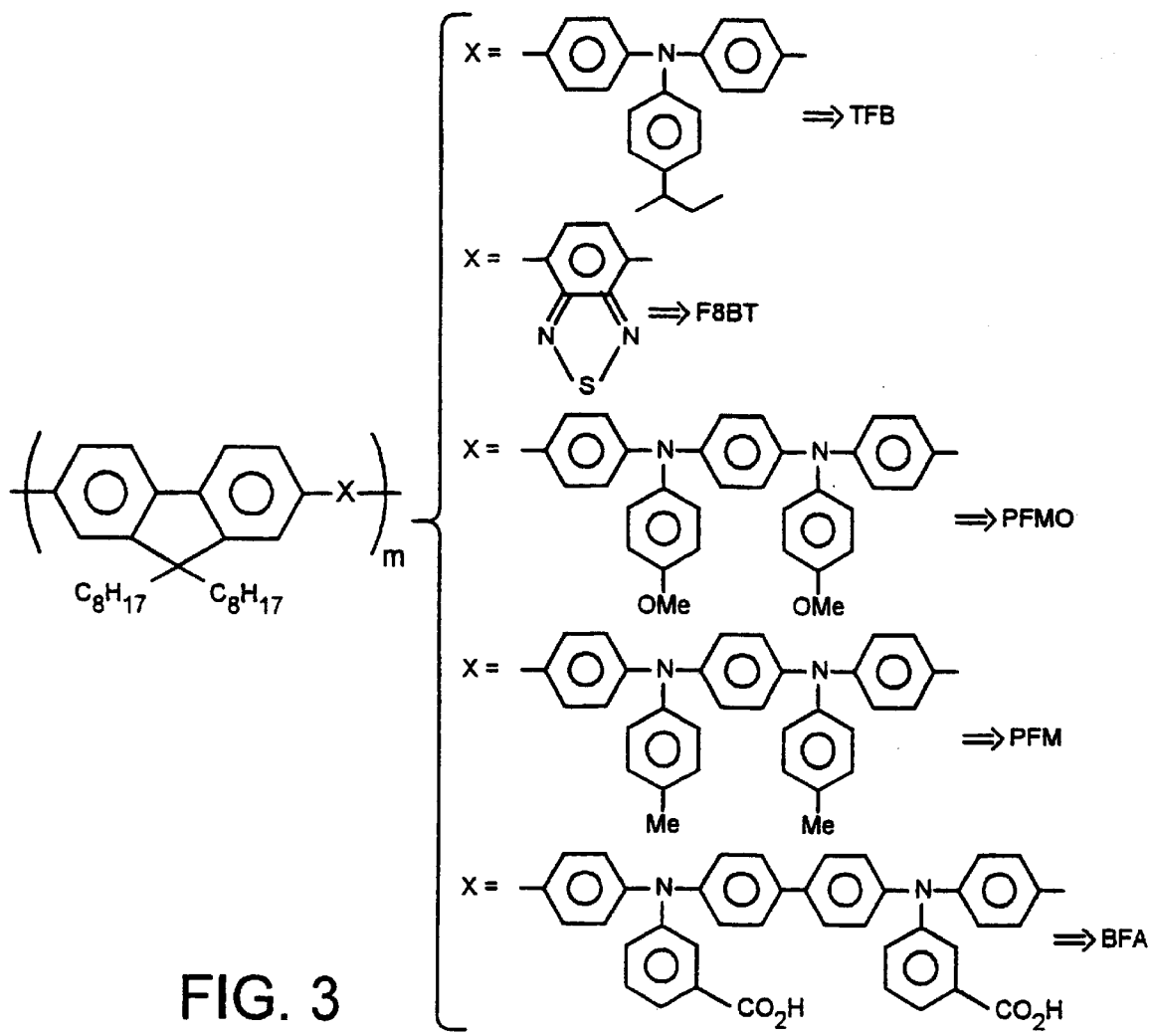
Figure 12:
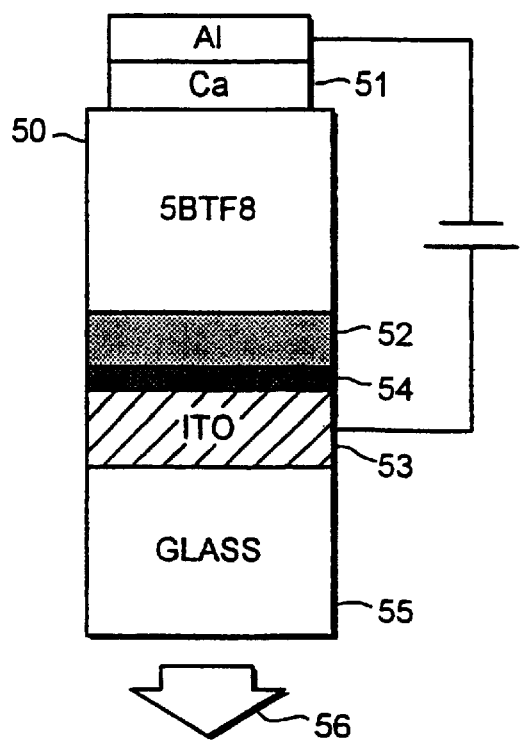
FIG. 12 is a schematic cross-sectional view of a device having 5BTF8 as the emitting material.
Figure 13:
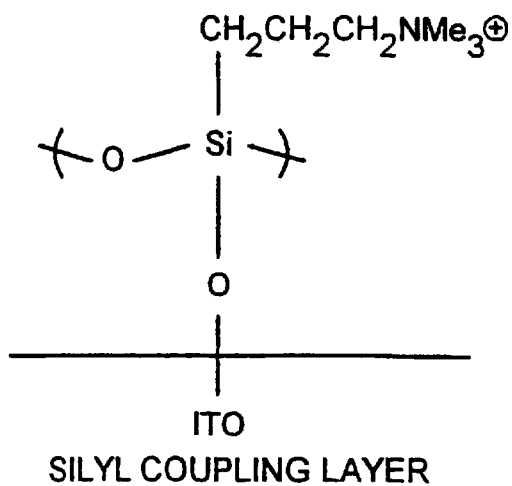
FIG. 13 shows the chemical structure of a silyl coupling layer.

This example describes the fabrication of an organic light emissive device (OLED) (illustrated schematically in cross-section in FIG. 12) comprising the 5BTF8 blend (see also FIG. 3) as the emitting material 50; a calcium-aluminium cathode 51; and an interlayer based on PEDOT:PSS and PPV next to the ITO anode 53. There is a silyl coupling layer 54 (see also FIG. 13) between the PEDOT:PSS/PPV 52 and the ITO 53. The device is-formed on a glass substrate 55 and in operation light is emitted through the glass as shown generally by arrow 56 when a voltage is applied between the anode and the cathode.

A polyelectrolyte self-assembly process is employed to build the interlayer 52. This process is particularly attractive as a general versatile method to form an ultra-thin, continuous and conformal polymer multilayer film (preferably on appropriately-treated substrates) by the sequential adsorption (deposition) of one polyelectrolyte carrying a net charge of one sign and then another polyelectrolyte carrying a net charge of the other sign. A multilayer film can be formed by repeating a cycle of steps. Each assembly cycle consists of immersing the substrate in each of the two polyelectrolyte solutions in turn, to deposit a pair of successive sub-layers from the solutions, with extensive rinsing steps in between. Each assembly cycle thus assembles one bilayer of the multilayer film.

Such a polyelectrolyte self-assembly process was first described by Decher and co-workers. See for example: G. Decher, J. D. Hong and J. Schmitt, "Buildup of ultrathin multilayer films by a self-assembly process, 3. Consecutively alternating adsorption of anionic and cationic polyelectrolytes on charged surfaces," Thin Solid Films, Vol. 210/211, pp. 831–835, 1992. It has subsequently been employed to fabricate the entire emitting layer in a polymer LED by Rubner and co-workers. See for example: O. Onitsuka, A. C. Fou, M. Ferreira, B. R. Hsieh and M. F. Rubner, "Enhancement of light emitting diodes based on self-assembled heterostructures of poly(p-phenylene vinylene)," Journal of Applied Physics, Vol. 80, pp.4067–4071,[1996]; A. C. Fou, O. Onitsuka, M. Ferreira and M. F. Rubner, "Interlayer interactions in self-assembled poly(phenylenevinylene) multilayer heterostructures: implications for light-emitting and photorectifying diodes," Materials Research Society Symposium and Proceedings, Vol. 369, pp. 575–580, 1995; and A. C. Fou, O. Onitsuka, M. Ferreira, M. F. Rubner and B. R. Hsieh, "Fabrication and properties of light-emitting diodes based on self-assembled multilayers of poly(phenylene vinylene)," Journal of Applied Physics, Vol. 79, pp. 7501–7509, 1996. In the last of these reports, the authors found a weak enhancement in LED performance when. they terminated the film with the insulating polymethacrylate/polyallylammonium pair before depositing the calcium cathode. They also reported improvements in a di-block composite emitting layer fabricated With a polystyrenesulfonate/PPV block in contact with the ITO anode and a polymethacrylate/PPV block in contact with the calcium cathode. Another appropriate reference is T. Ostergard, J. Paloheimo, A. J. Pal and H. Stubb, "Langmuir-Blodgett light-emitting diodes of poly(3-hexylthiophene): electro-optical characteristics related to structure," Synthetic Metals, Vol. 88, pp. 171–177, 1997, which describes fabrication of a bi-structured emitting polymer layer by Langmuir-Blodgett deposition.

The process to be described below offers substantial enhancements over those reported in prior documents. Firstly, the present process permits the fabrication of an interlayer rather than the whole emitting layer; this allows a degree of independent control that has not previously been possible. Secondly, the present process aims towards a gradation in the composition/property(ies) of the interlayer in the growth direction, and this gradation can be specially engineered to achieve significant improvement in LED performance.

An appropriately-treated ITO surface was prepared in this example by surface silylation with 3-aminopropyltrimethoxysilane. The polyelectrolyte self-assembly was carried out under dust-free conditions in a laminar flow cabinet. Commercially available p-doped PEDOT:PSS (available from- Bayer AG) serves as the polyanion. This material comprises closely-associated PEDOT and PSS polymer pairs, with the ratio of negatively-charged sulfonate groups (on PSS) to the positively-charged thiophene rings (on PEDOT) approximately 3, so that the polymer pair is overall negatively-charged. For its self-assembly partner, poly(p-xylylene tetrahydrothiophenium chloride) (PPV-THT) was used. This polymer eliminates tetrahydrothiophene and hydrochloric acid at elevated temperatures to give conjugated p-phenylenevinylene (PPV) sequences that could advantageously support charge transport (here hole transport) and injection in one direction through a deposited layer but impede electron-leakage in the opposite direction through, the layer and/or one or both of its interfaces with adjacent layers. The device is then completed by depositing a 5BTF8 emitting polymer layer of thickness 860 Å by spin-coating, and then a calcium cathode of thickness 2000 Å and an aluminium capping layer of thickness 1000 Å by thermal evaporation.

Several different types of devices were made to exemplify the invention. Device I is a control device comprising a hole-transport layer of PEDOT:PSS of thickness 320 Å deposited directly on the ITO substrate by spin-coating, and with the emitter layer spun over the PEDOT:PSS. Device II comprises a six-bilayered film of PEDOT:PSS/PPV deposited on the silylated ITO substrate by polyelectrolyte self-assembly. 5BTF8 is then deposited over this interlayer film by spin-coating. The PEDOT in the interlayer is substantially fully doped (ie. highly conducting). Device III comprises a six-bilayered film of PEDOT:PSS/PPV but with the PEDOT doping-level progressively reduced during the assembly, so that the PEDOT in the ultimate bilayer is essentially undoped (i.e. poorly conducting). Device IV is built in the same way as device III except that an additional bilayer of polystyrenesulfonate/PPV is assembled as the capping layer over the PEDOT:PSS/PPV film. Device V is built similarly to device II except that the PEDOT is substantially undoped.

The PEDOT doping-level in the assembly solution is readily adjusted by controlled reaction with hydrazine, which reduces p-doped PEDOT with the formation innocuous $N_2$ as by-product. In this way, PEDOT with decreasing (or in general gradually varying) doping-level can be assembled into the interlayer film. To suppress the possible scrambling of the doping-level due to cocurrent charge and ion-transport through the growing interlayer, a basic solution medium was employed throughout. In this medium, $NH_4^+$ ions instead of the more mobile $H^+$ ions maintain charge neutrality.

The manufacture of the five example devices (devices I to IV) will now be described.

Processing Details for Devices I to V (1) ITO Surface Derivatisation

The following procedure was adopted to prepare ITO surfaces with well-defined pH-insensitive and redox-inactive quaternary ammonium functionalities:

The ITO-coated glass substrates (10 Ω/square, Balzers) were, first patterned, cleaned by an RCA recipe ($H_2O:H_2O_2:NH_3$, 10:2:0.6, 50–60° C., 30 min), then baked in vacuum (165–70° C., 150 min) to remove physisorbed water, and cooled under dry nitrogen in a glove-bag. While in the glove-bag, the substrates were treated in a silylating bath (95° C., 2 h) to form —$CH_2CH_2CH_2NH_2$ groups that tether to the ITO surface. The silylating bath (20 ml) consisted of 5 vol. % 3-aminopropyltrimethoxysilane (Aldrich) in HPLC-grade toluene (Aldrich) previously dried over 4 Å molecular sieves. The substrates were then washed in HPLC-grade toluene (1×50 ml), HPLC-grade methanol (2×50 ml) and HPLC-grade isopropanol (2×50 ml) in that order. Inspection by viewing under oblique illumination showed no sign of silica gel formation which would result if insufficient care was taken.

The substrates were subsequently treated in a methylating bath in the dark (25° C., 3 h) to quaternise —$CH_2CH_2CH_2NH_2$ to the pH-insensitive and redox-inactive propyltrimethylammonium ions (—$CH_2CH_2CH_2NMe_3^+$). The methylating bath (20 ml) consisted of 5 vol. % $CH_3I$ (Aldrich) and 0.5 vol. % triethylamine as acid-scavenger in HPLC-grade N,N-dimethylformamide (Aldrich). The substrates were then washed in deionised $H_2O$ (3×50 ml) and HPLC-grade isopropanol (1×50 ml), and dried in a drying cabinet at 50° C. Visual inspection at this stage showed that the derivatised ITO surface essentially remained clear.

Figure 14:
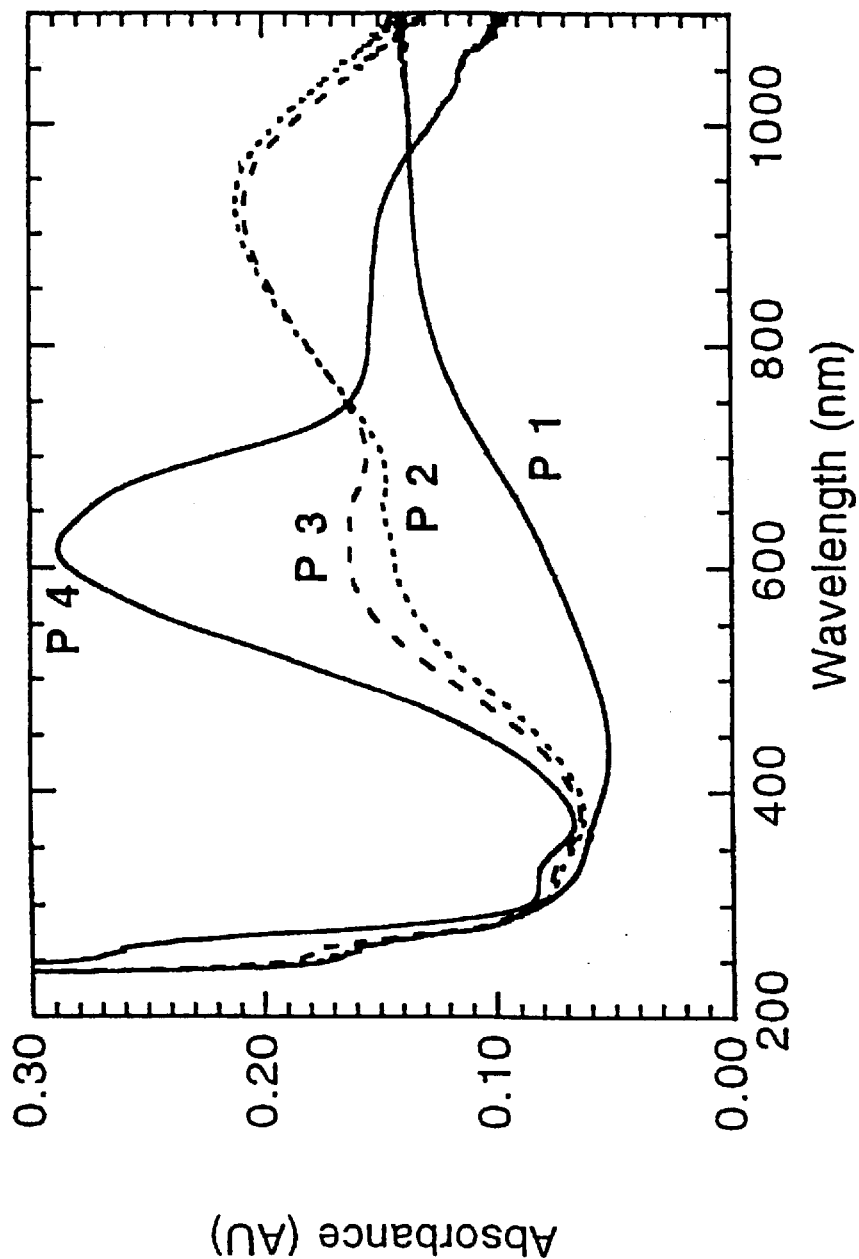
FIG. 14 shows UV-visible absorption spectroscopy measurements of the assembly solutions for devices I to IV.
Figure 15:
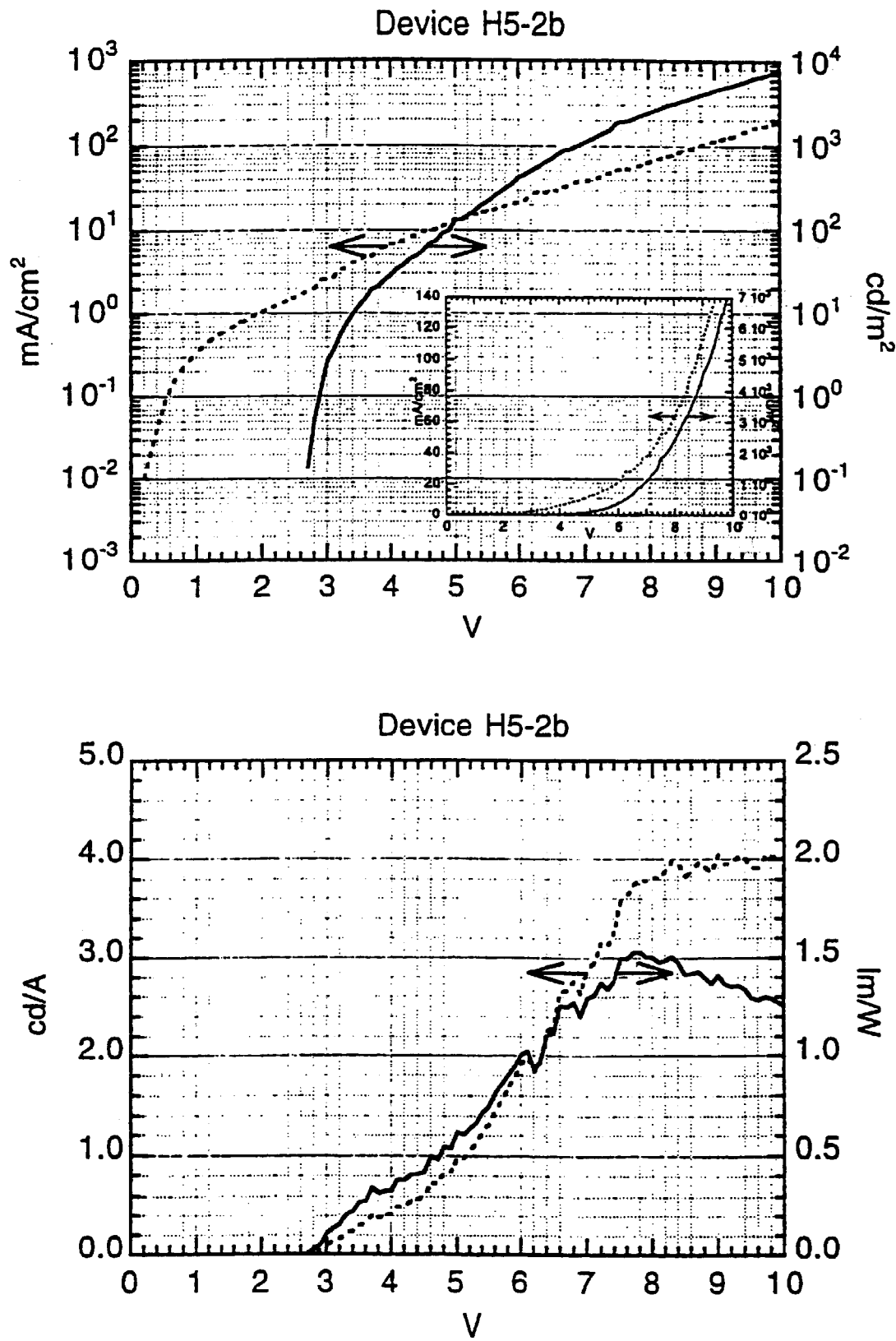
FIGS. 15 to 19 show the current and light-output performance an efficiency against voltage of devices I to V respectively.
Figure 16:
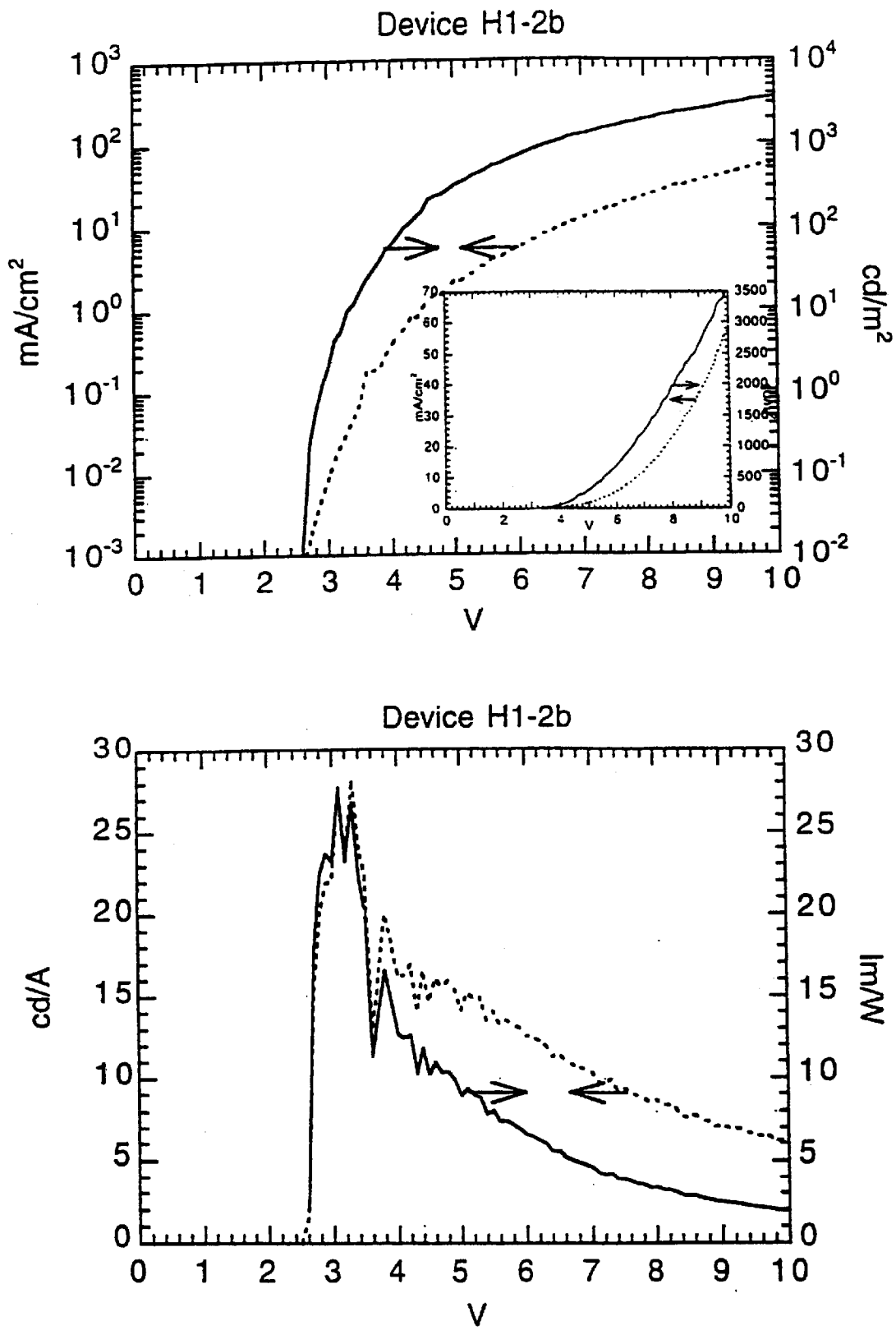
Figure 17:
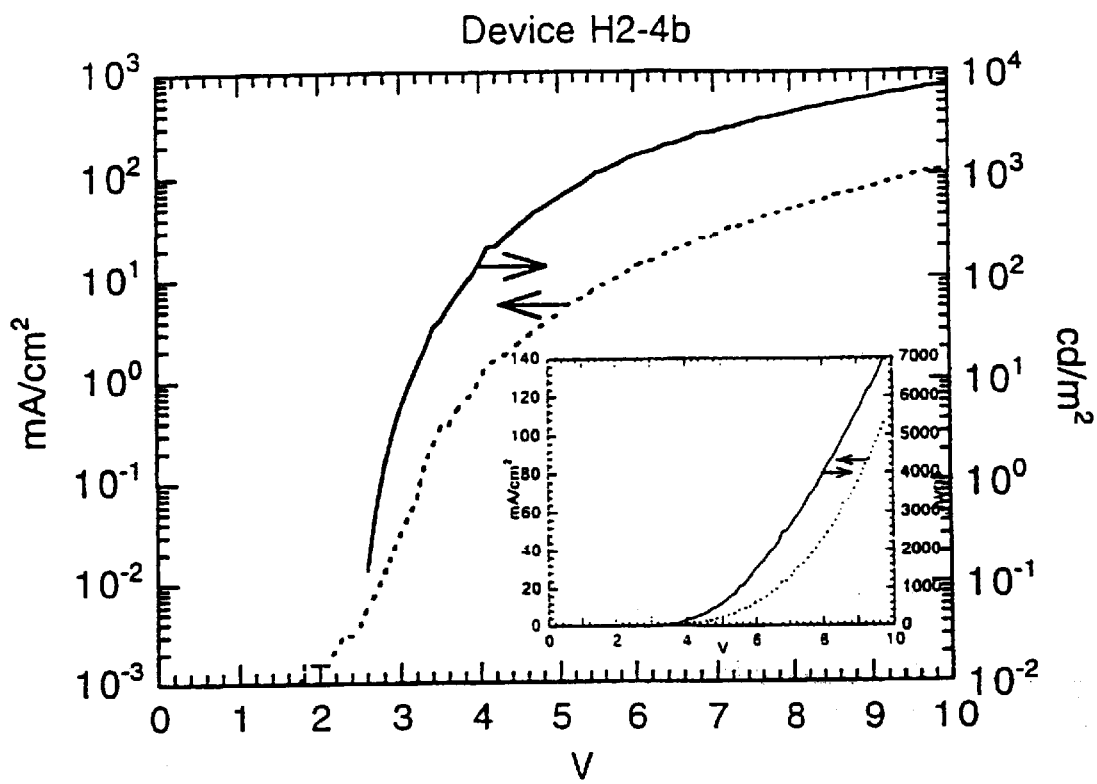
Figure 17:
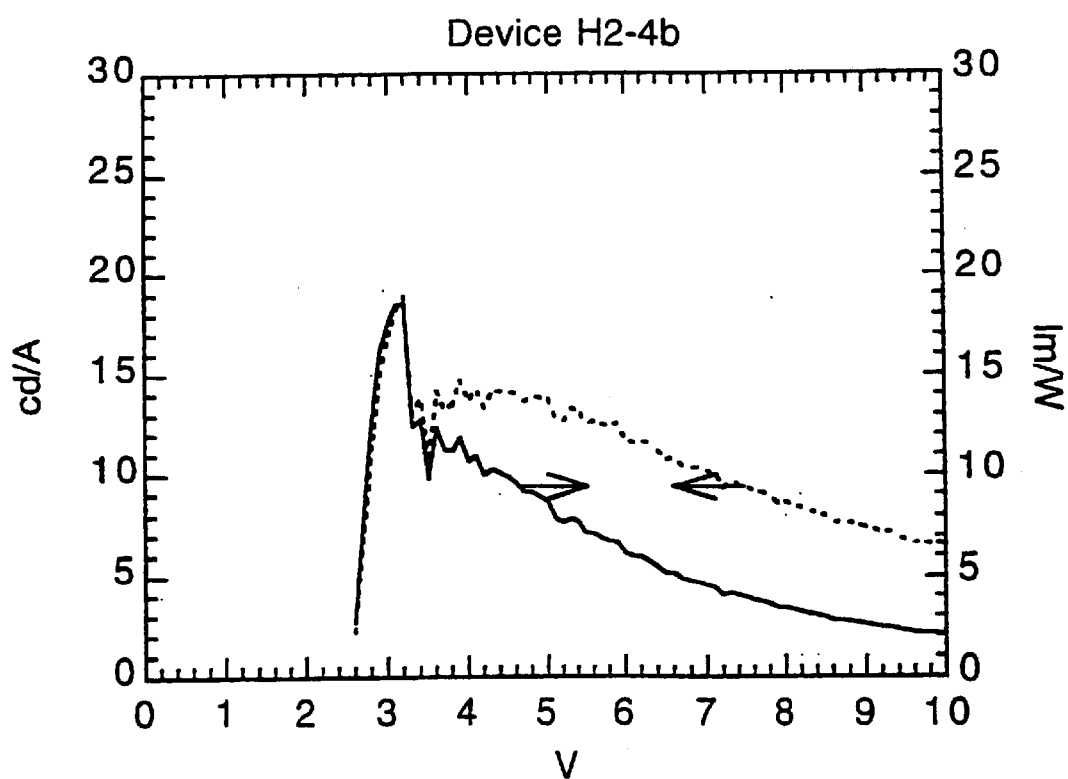
Figure 18:
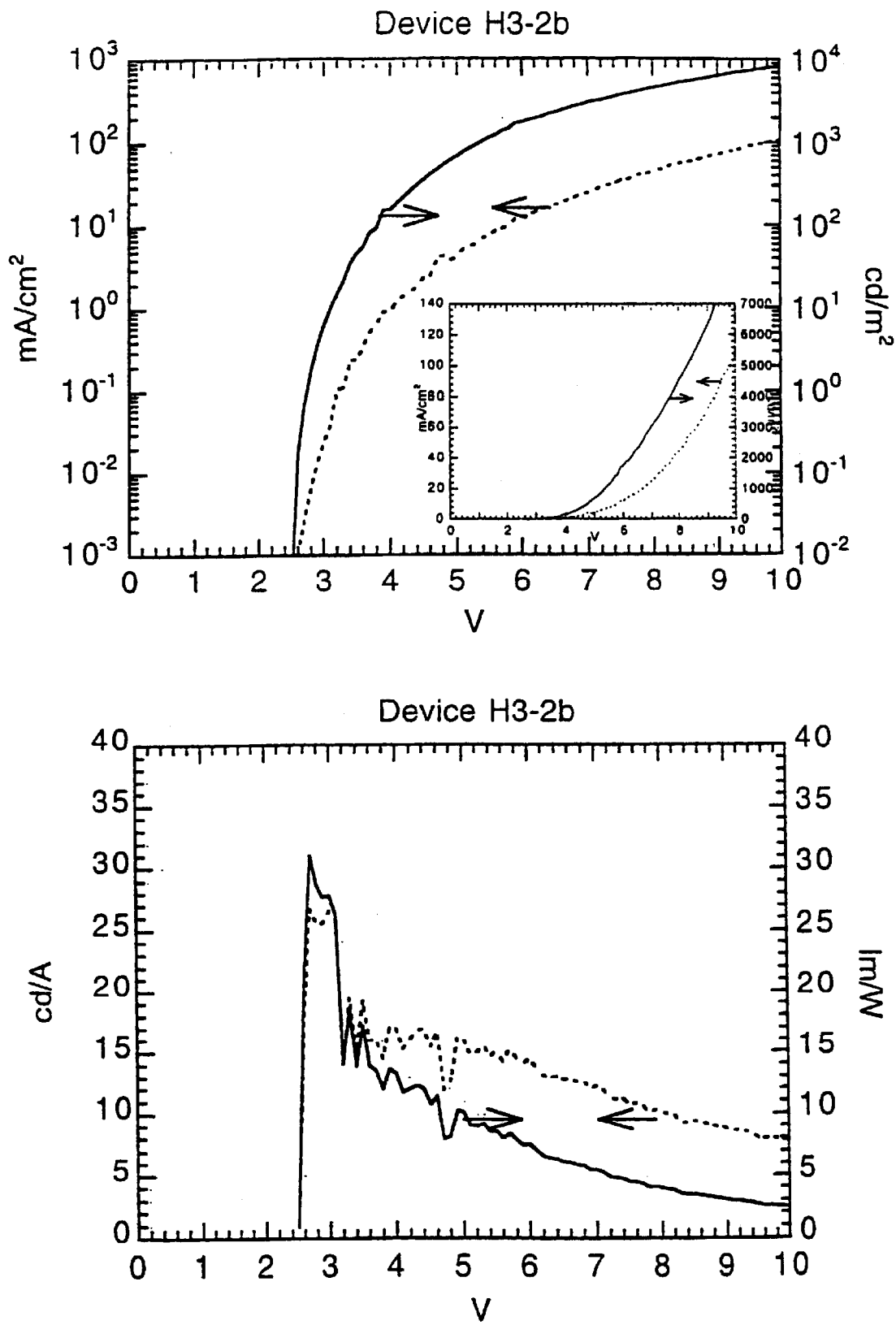
Figure 19:
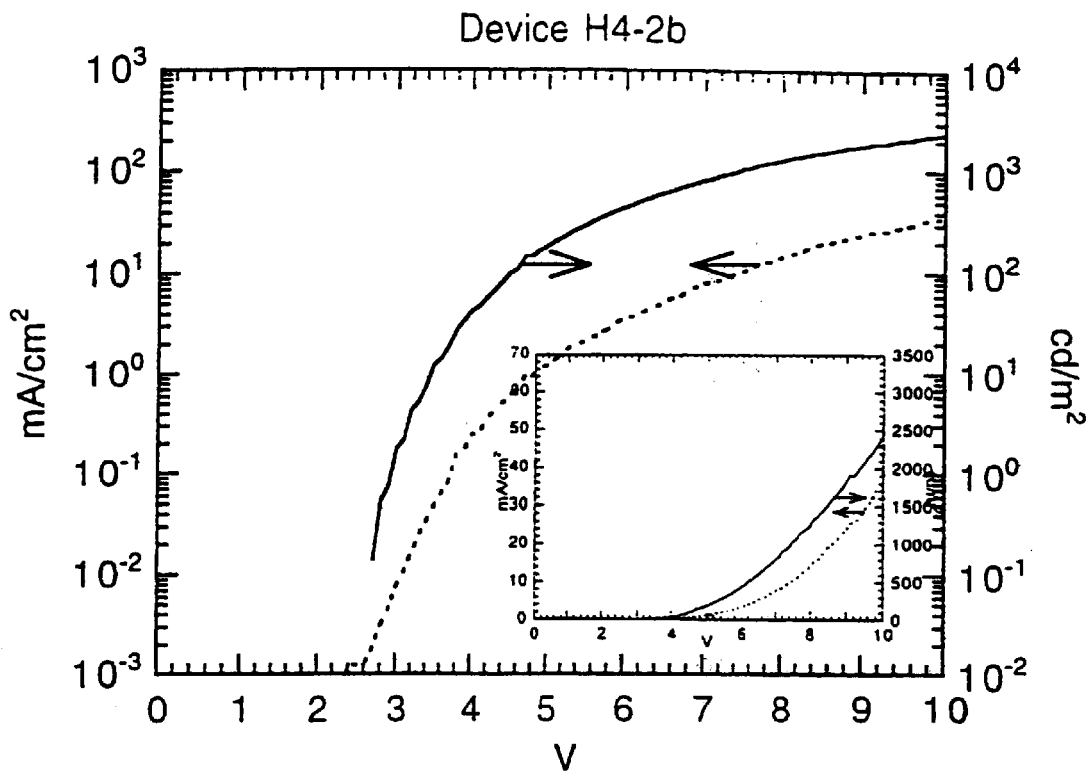
Figure 19:
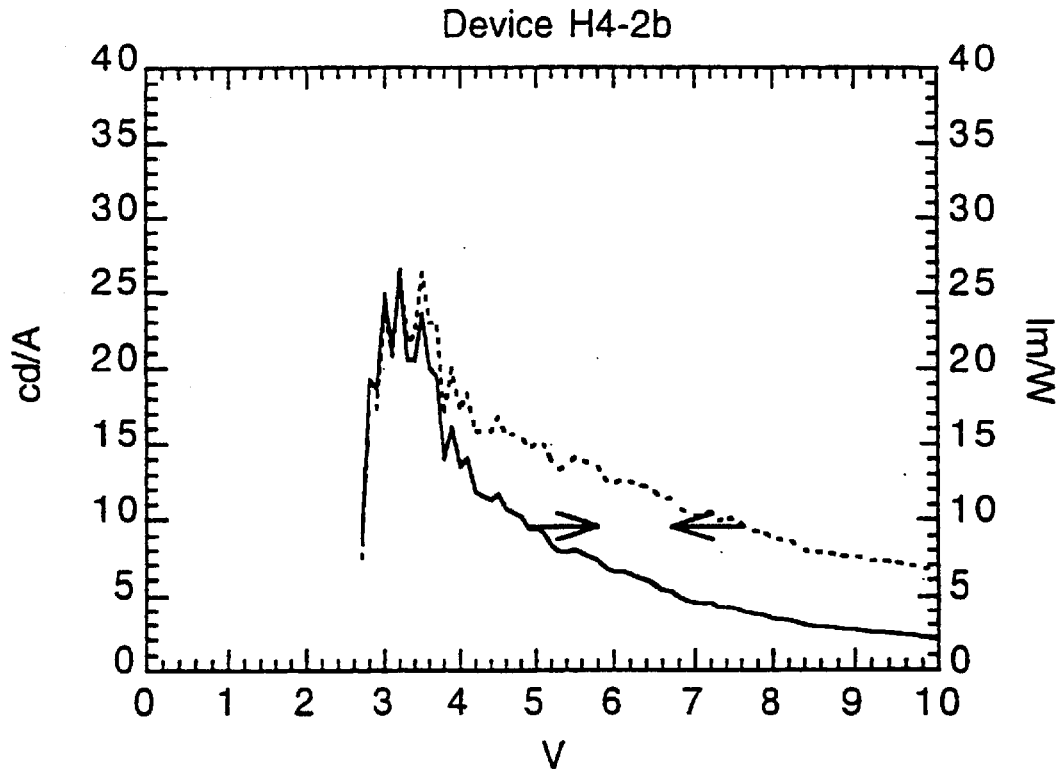

(2) Preparation of the PEDOT:PSS Assembly Solution with Controlled PEDOT Doping-Levels Four solutions of PEDOT:PSS with decreasing level of doping (P1 to P4) were prepared from commercial material (Bayer AG's trial product A14071). 2.0 ml of the dark-blue solution of fully-doped PEDOT:PSS (1.6 w/v % total solids) was reacted with the following volumes of 55 w/v % hydrazine hydrate (Aldrich):

0.00 ml (none) to prepare material P1,
0.20 ml to prepare material P2,
1.0 ml to prepare material P3,
8.0 ml to prepare material P4;

each in a sealed amber vial together with enough distilled water to make up the total reaction volume to 10.0 ml. The reaction mixture was warmed to 70° C. for 3 h during which dedoping of PEDOT took place. The solutions were then allowed to stand overnight. No precipitation was observed. UV-vis absorption spectroscopy measurements of the resultant solutions (shown in FIG. 14) indicated success of the selective dedoping. The spectrum of the P1 solution is characteristic of fully-doped PEDOT (which is approximately 30%-doped), while that of the P4 solution is characteristic of undoped PEDOT (i.e. approximately 0%-doped). The spectra of P2 and P3 lie intermediate between the two, corresponding to about 25% and 20% respectively, as estimated from the corrected intensity of the Π–Π* transition at 620 nm. The dc conductivity measured by four-in-line probe on micron-thick films cast onto glass substrates is also consistent with decreasing levels of doping: 1.0 S/cm for P1, 0.01 S/cm for P2, 0.008 S/cm for P3 and 0.004 S/cm for P4.

To prepare the PEDOT:PSS assembly solutions, 9.5 ml of each of the resultant P1 to P4 solutions were mixed with 10 ml 50 mM aqueous NaCl to fix the final ionic strength at 25 mM, and the pH adjusted to 11 by addition of 50 $\mu$l 35 w/v % aqueous $NH_3$. This therefore gave approximately 0.15 w/v % total polymer solids in the assembly solutions. The NaCl solution was made with deionised water. The ionic strength of the solutions was kept at 25 mM to swamp out the influence of ionic impurities in commercial polyelectrolytes and provide a constant ionic background for the self-assembly.

(3) Preparation of the PPV-THT Assembly Solution

To prepare the PPV-THT assembly solution, 2.05 g of a poly(p-xylylene tetetrahydrothiophenium hydrochloride) solution in methanol (1.1 w/v % total solids, prepared according to standard literature procedures, see for example R. A. Wessling, "The polymerisation of xylylene bisdialkylsulfonium salts", Journal of Polymer Science Polymer Symposium 72, pp 55–66, 1985) was mixed with 18 ml 25 mM NaCl solution, and the pH was adjusted to 11 by addition of 50 $\mu$l 35 w/v % aqueous $NH_3$. The PPV-THT content in the assembly solution was therefore approximately 0.1 w/v %.

(4) Polyelectrolyte Self-Assembly

To form the interlayer film, polyelectrolyte self-assembly was performed at room temperature (22° C.) in a laminar flow cabinet within two hours after making up each polyelectrolyte solution.

(a) To assemble the one bilayer of the interlayer for device II, the derivatised ITO substrate was immersed in the P1 solution for 10 minutes, rinsed vigorously in 2×30 ml fresh deionised water for a total of 1 minute; then immersed in the PPV-THT solution for 10 minutes, and finally rinsed in 2×30 ml fresh deionised water for 1 minute. This cycle was repeated five more times to assemble the six-bilayered film of fully-doped PEDOT:PSS/PPV on the ITO anode.

(b) The first three bilayers of the interlayer in device III were fabricated following the protocol described above for device II. Then the PEDOT:PSS assembly solution was changed to P2 for the next assembly cycle, then to P3 and finally to P4. The idealised composition of the resulting polymer multilayer film was thus three bilayers of 30%-doped (fully-doped) PEDOT, followed by one bilayer of 25%-doped PEDOT, then one bilayer of 20%-doped PEDOT, and finally one bilayer of undoped PEDOT.

(c) The first six bilayers of the interlayer film in device IV were fabricated as described above for device II. After that, an additional assembly cycle in a polyanion solution of poly(styrenesulfonate, sodium salt) followed by a polycation solution of PPV-THT was used to assemble the capping layer of PSS/PPV over the PEDOT:PSS/PPV film. The poly(styrenesulfonate) solution was made by adding 24 mg of poly(styrenesulfonate, sodium salt) (molecular weight= 70,000; from Aldrich) to 20 ml 25 mM NaCl solution and pH adjusted to 11 by addition of 50 µl 35 w/v % aqueous $NH_3$.

At the completion of the assembly process, the substrates were transferred to a vacuum heating rig inside a glove-box and baked at 70° C. in a dynamic vacuum (pressure less than $10^{-6}$ mbar) for 2 hours to drive off loosely bound water molecules from the self-assembled polyelectrolyte films and to effect a partial conversion of the PPV-THT to give short conjugated segments of oligo-p-phenylenevinylene sequences. Higher baking temperatures were found to give rise to considerable unproductive leakage currents during device operation at low voltages. The subsequent steps were all performed in the glove-box.

(5) Emissive Polymer and Metal Cathode Deposition

An 860 Å 5BTF8 film was deposited on top of the self-assembled polymer films by spin-coating at 1400 rpm from a 1.5 w/v % p-xylene solution. A 2000 Å calcium layer was thermally evaporated at 20 Å/s under a base pressure of $10^{-6}$ mbar through a shadow mask to define eight 1.5 $mm^2$ (nominal) light-emitting diodes on each device substrate. A thin aluminium protective layer of thickness 1000 Å was then evaporated over the calcium.

(6) Control Device

The bilayer control device I was fabricated by preparing an RCA-cleaned ITO substrate and spin-coating a 320 Å PEDOT:PSS film on to it at a rate of 1850 rpm from a 0.8 w/v % aqueous solution. The film was then baked at 70° C. as described in part (4), after which an 860 Å 5BTF8 film, followed by a 2000 Å calcium layer and a 1000 Å aluminium protecting layer, were deposited as described in part (5).

To reduce scatter due to variations in the fabrication process, all five devices were fabricated in one batch.

FIGS. 15 to 19 show the representative performance of devices I to V respectively. The top panel of each figure gives the brightness of the device and also the current density through the device against applied voltage. The bottom panel of each figure gives the power efficiency and also the quantum efficiency of the device against applied voltage.

Figure 20:
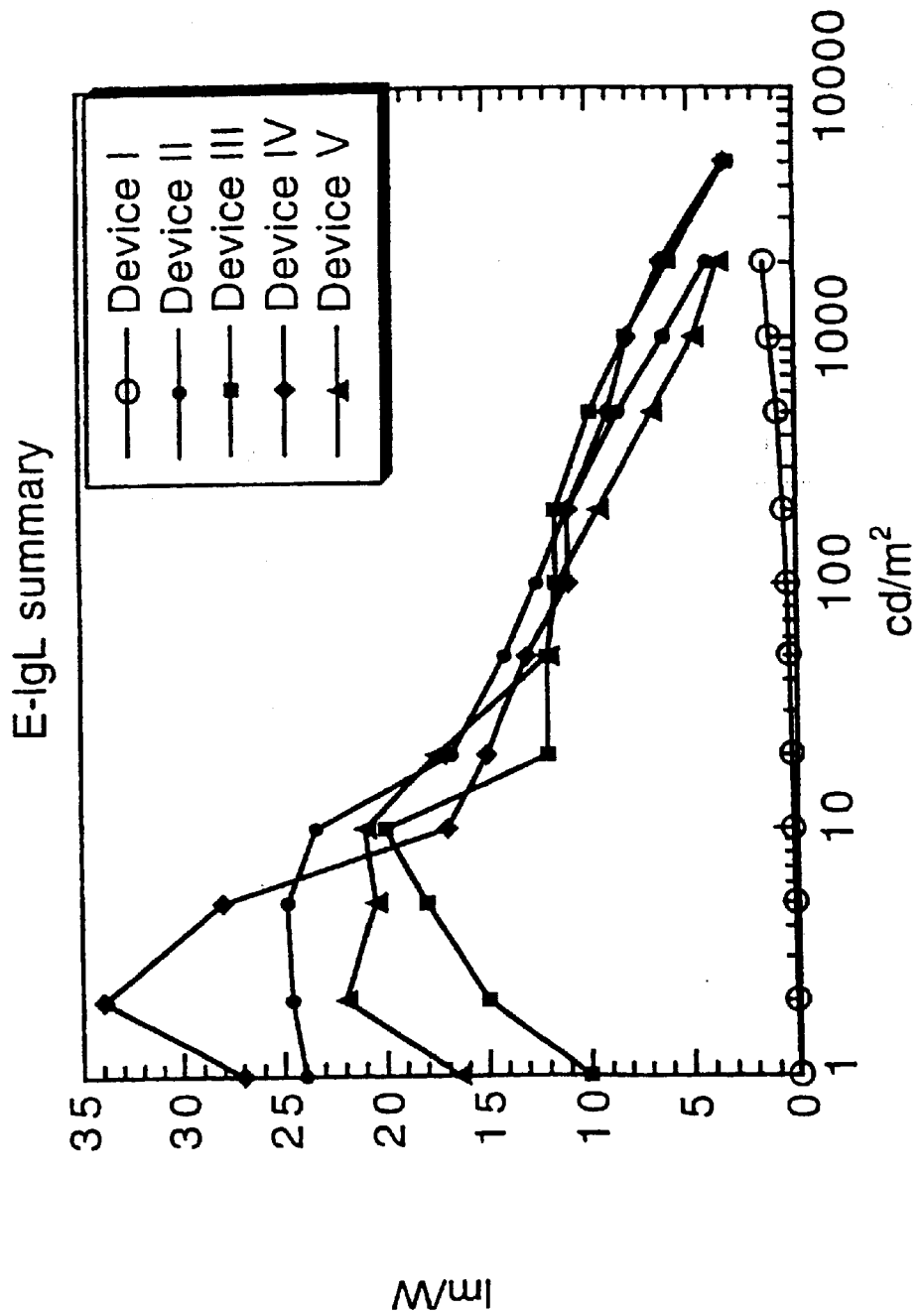
FIG. 20 shows the power efficiency of devices I to V against brightness.

The following table summarises the drive voltage and power efficiency of the devices at selected brightnesses. The data was obtained by averaging over 3–4 of each type of device.

power efficiency at a moderately low drive of 3–4V and a brightness of about 10 $cd/m^2$ is achieved for the interlayer devices II to V. At even lower voltages, these devices are even more efficient. Power efficiencies up to 20–30 m/W are readily attained just after device turn-on. (See FIG. 20, which plots the power efficiency of the devices against brightness). The power efficiency decreases with increasing drive voltage and brightness. However, even at a moderately high brightness of 1000 $cd/m^2$, a twofold to threefold enhancement over the control device is still achieved. One approach to shifting the high 1 m/W values to higher brightnesses is to increase the thickness of the 5BTF8 layer. In particular, the thickness could be increased to around 1000, 1200, 1500 or even up to around 2000 Å.

Figure 21A:
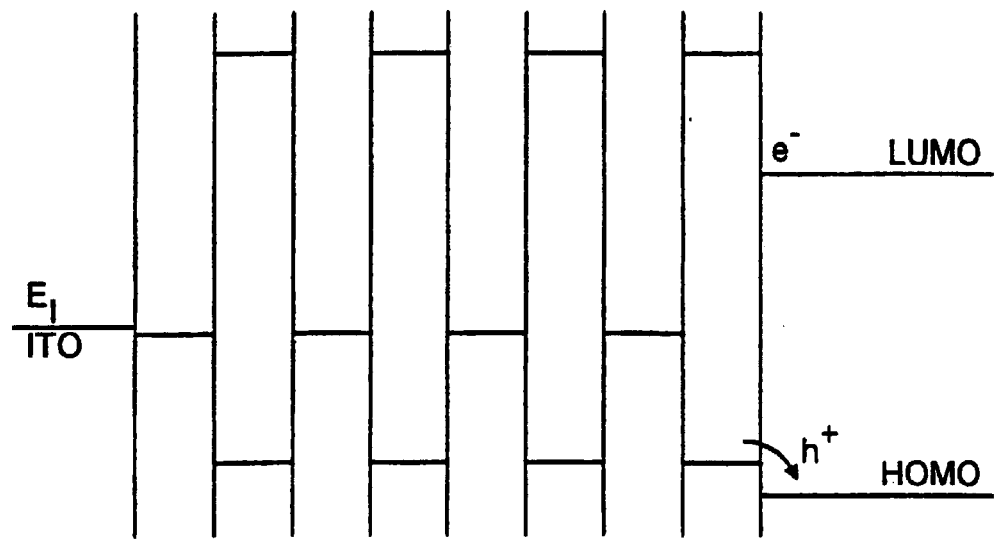
FIGS. 21a and b illustrate energy levels in two example devices.

The PEDOT:PSS/PPV interlayer configuration is thought to provide a hole-transport but electron-blocking function that facilitates charge recombination and helps confine the excitations to the emitter layer. The presence of semiconducting PPV layers in the stratified PEDOT:PSS/PPV assembly, especially as the termination layer, is believed to play an important role in this. The semi-converted PPV is expected to have the LUMO level for electron-transport several tenths of an electron-volt higher than that of PEDOT, F8BT and F8 (see FIG. 21a), which could exert a blocking effect on the electrons crossing the interface from the opposite direction. The confined electrons would advantageously redistribute the electric field in the device to improve the balance of electrons and holes injected into the device. The PPV layer would also assist in isolating the subsequently formed excitations from direct contact with the ITO anode which leads to some non-radiative loss. The PEDOT on the other hand provides a hole-transport function to the interlayer, assisting in hole-injection across the interface with the emitter layer. The net effect would then be improved electron-hole balance coupled to an improved electron-hole capture and a higher fraction of radiative recombination. This is believed to lead to the greatly improved power efficiency that is observed in the interlayer devices.

As a result of the transport layer the drive voltage needed to produce a selected light output is considerably reduced for these interlayer devices. This is highly desirable because it reduces the electrical stress in the device during operation, which then usually leads to longer operating lifetimes. The reduction in drive voltage is most marked for the graded interlayer devices III and IV. For example, the voltage needed to produce 1000 $cd/m^2$ drops from 7.1V for the control device I, to 6.3V in the interlayer device II, and further to 5.5V for the graded interlayer devices III and IV.

TABLE 3

| | Drive voltage for 10 $cd/m^2$ (V) | Power efficiency at 10 $cd/m^2$ (lm/W) | Drive voltage for 100 $cd/m^2$ (V) | Power efficiency at 100 $cd/m^2$ (lm/W) | Drive voltage for 1000 $cd/m^2$ (V) | Power efficiency at 1000 $cm/m^2$ (lm/W) |
|---|---|---|---|---|---|---|
| device I | 3.5 | 0.6 | 5.1 | 1.1 | 7.1 | 2.6 |
| device II | 3.3 | 23 | 4.0 | 12 | 6.3 | 6.0 |
| device III | 3.1 | 20 | 3.8 | 12 | 5.5 | 8.0 |
| device IV | 3.1 | 17 | 3.8 | 11 | 5.5 | 8.0 |
| device V | 3.4 | 21 | 4.5 | 12 | 7.3 | 4.5 |

Figure 22:
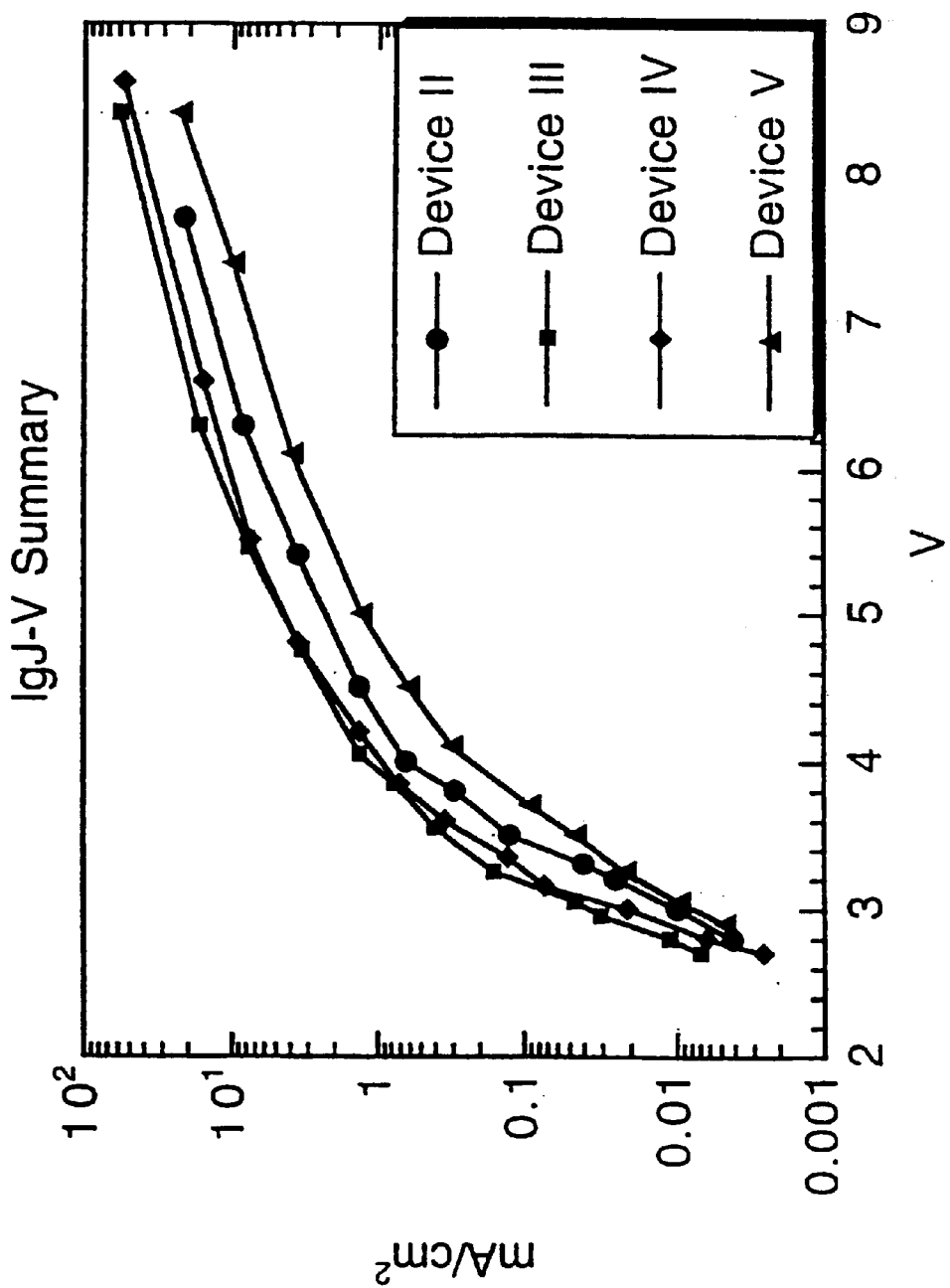
FIG. 22 plots the current density through devices I to V against applied voltage.
Figure 23:
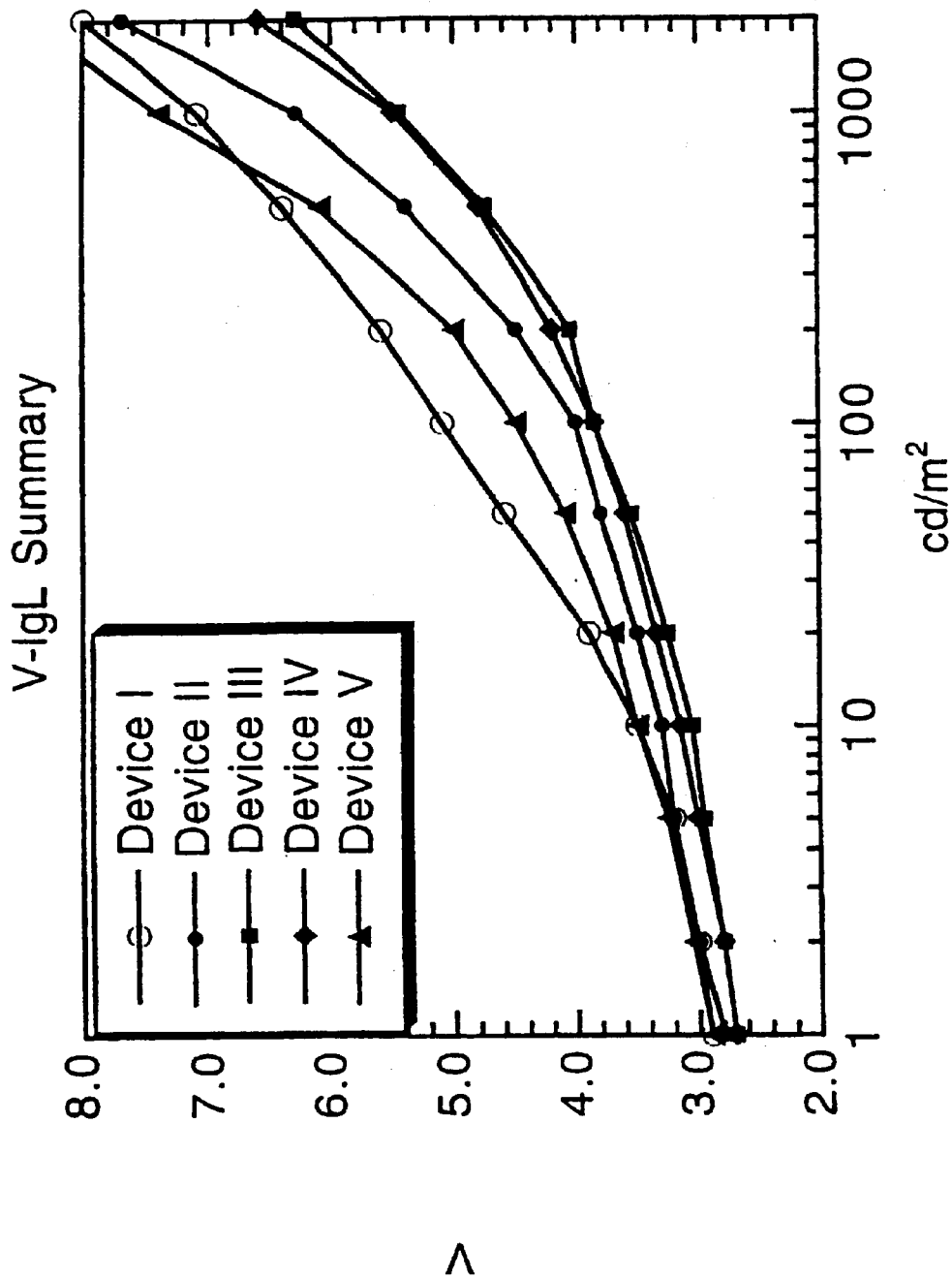
FIG. 23 plots the drive voltage for devices I to V against brightness.

The results indicate that the stratified PEDOT:PSS/PPV interlayer significantly improves the device power efficiency over the control device built with PEDOT:PSS alone. From the table above, a thirty-fold to forty-fold improvement in The improvement in devices with the electronically-graded interlayer is largely attributed to an increased ease in current injection, together with a lesser contribution arising from a weak enhancement of their power efficiencies. This is demonstrated more clearly in FIG. 22, which plots the current density through the different devices against applied voltage, and FIG. 23, which plots the drive voltage for the various devices against brightness. Therefore, it is clearly shown that a gradation in electronic properties could be built into an interlayer, and that such a gradation could be exploited to improve the performance of OLEDs.

Figure 21B:
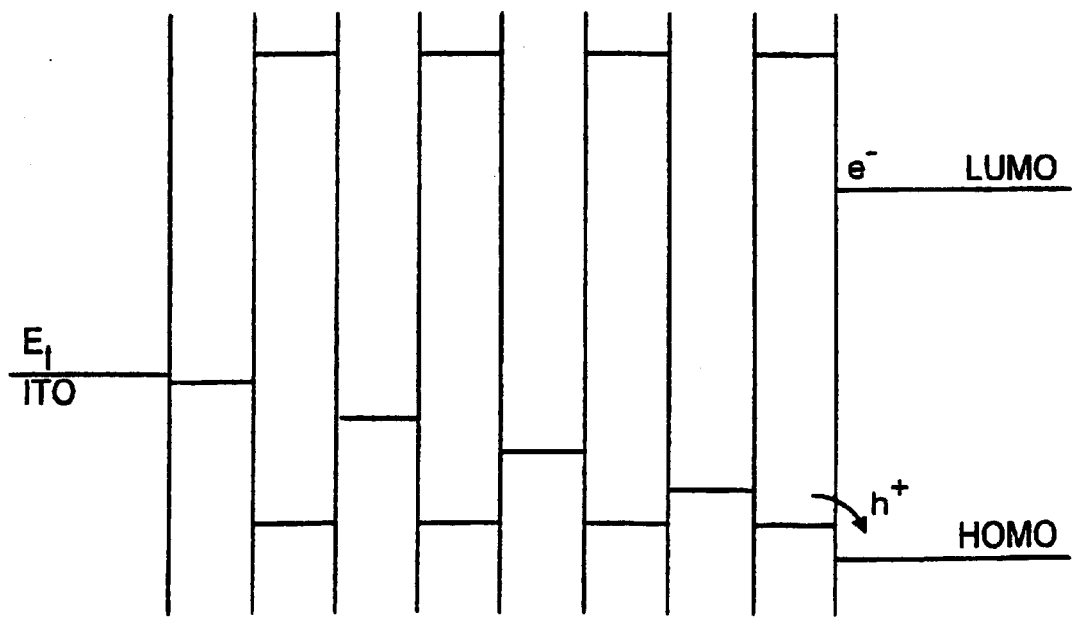

It is thought that the gradation in the conductivity or the HOMO level for hole transport leads to a picture that is schematically shown in FIG. 21b. The fabrication of an interlayer in which hole- or electron-transport states that more closely match in energy (and or molecular properties) to those in the adjoining layers with a gradation in-between reduces the thermodynamic energy mismatch for charge transport between adjacent layers. The thermodynamic barrier at the injection interface becomes smaller and less abrupt in the graded interlayer devices than in conventional bilayer devices utilising for example a fully-doped PEDOT layer which gives an electronically abrupt interface between it and the emitting polymer. Further, such a gradation may also prevent the electric field from developing abruptly at the interface by allowing a gradual change through the interlayer itself. This could reduce charge accumulation at the interfaces which usually leads to enhanced device degradation. In summary, such a spatial grading in the electronic properties of the interlayer therefore allows a more balanced electron-hole injection to be achieved at lower drive voltages in OLEDs.

Some preferred (but not essential) general features of the process and devices will now be described. Preferably each bilayer is formed of two components, one of which is preferably a semiconductor (e.g. PPV) and the other of which is preferably conductive (e.g. PEDOT:PSS). The semiconductor (if present) preferably provides an intermediate energy level between the conductive material (if present) and the emissive material of the device. Preferably the sub-layer that abuts (or is closest to) the emissive material is a sub-layer of the semiconductor. There could be another layer (e.g. a conductive layer) between the last sub-layer and the emissive material. The components of successive bilayers need not be the same—for example different conductive materials could be used in each layer. One or more of the bilayers may be replaced by layers that have more than two sub-layers. Each sub-layer is suitably formed of a polymer material and is preferably one polymer chain deep (the precise thickness being determined by the conformation of the chain). In some preferred embodiments a conduction energy level of the conductive material varies between successive bilayers, and preferably in the direction towards the emissive material it increases or decreases between successive bilayers towards a HOMO or LUMO level of the emissive material. Especially where the properties of the conductive material vary in this way another layer could be omitted and the bilayers replaced, in effect, by monolayers. The process could be applied to devices other than light-emissive devices, especially in cases where charge injection is to be improved.

It is believed that the PSS may dope the PPV to some degree, with the degree of doping increasing if the PPV is converted by baking at higher temperatures such as greater than 100° C.

It should be noted that the interlayer devices show sharp (diode-like) turn-on characteristics like those of conventional bilayer devices, which contrasts with single-layer 5BTF8 devices.

Importantly, the results demonstrate that the present method allows especially fine control over gradation of electronic properties (e.g. doping) and the benefits of such gradation.

This fabrication method provides a means to exploit layer-by-layer forming techniques to build an interlayer with controlled variation of one or more electronic and/or optical parameters such as energy levels or energy level distributions (especially those that are responsible for charge carrier transport), the effective work function, electron affinity, ionisation energy and/or band gap across the interlayer thickness. By matching one or more of these to the characteristics of one or more of the materials adjacent to the interlayer in a finished device, an advantageous manipulation of barrier (e.g. energy barrier) heights and widths may be achieved. This may then provide additional control parameters that could be exploited to optimise the performance of a light emitting device (especially an organic light emitting device) in terms of brightness, efficiency, lifetime, drive voltage and/or colour.

The method also exploits composition grading as a means to allow for matching of the molecular interaction parameters with the material on both sides of the interlayer, so that the desired level of adhesion could be maintained between the two materials in contact with the interlayer. This may also allow further optimisation of device performance.

This approach to gradation through the thickness of the PEDOT:PSS layer may be applied to other materials, especially polymers (including oligomers). The approach may be used to provide a variation in one or more of the following characteristics through the thickness of the layer: composition, level of doping, electron affinity, ionisation potential, work function, band gap and molecular interaction to control charge injection and/or adhesion. Preferably this variation is provided by the PEDOT:PSS layer comprising a plurality of sub-layers of differing compositions. Alternative materials could be used in devices that embody the principles described above. For example, sulphonated or other appropriately derivatised polyanilines, polythiophenes, poly (vinylcarbazoles), poly(vinylnaphthalenes) or materials based on those, or other materials.

In a light emissive device the graded layer may suitably lie adjacent to the light-emitting material, either at the interface between the anode or layers in contact with the anode (e.g. PEDOT) and the emitting material; and/or at the interface between the cathode or layers in contact with the cathode and the emitting polymer; and/or at the interface between two light-emitting materials. The thickness of the graded layer is suitably in the range from 5 to 1000 Å or more, preferably in the range from 5 to 200 Å or more.

The graded layer is suitably a polymer layer, preferably a polymer interlayer. The graded layer is suitably formed either by deposition of a series of sub-layers of differing properties (e.g. composition) or by deposition of a layer (or a series of sub-layers) with some or all deposition steps or just the final deposition step being followed by a step to modify the properties of at least the last-deposited layer/sub-layer. The layers or sub-layers may be in the form of films.

The finished graded layer suitably has a composition variation in its thickness direction. This suitably leads to a variation in electronic or molecular properties across its thickness. This spatial variation in composition could be diffuse or abrupt, and could extend through all or part of the thickness of the layer. The variation could, for example, derive from two or more completely distinct chemical entities (such as PEDOT and PPV as in device I) put together in a sequential manner, or from continuous variation in the level of doping or dedoping (such as PEDOT with a different degree of backbone charging as in devices II to IV) of the interlayer material. The variation in composition could be present when the layer is first fabricated or could be induced by physical and/or chemical treatments subsequent to its fabrication, for example by exposure to electromagnetic radiation (such as UV radiation), or high-energy particles like those contained in plasma, or by chemical reactions limited by one or more of diffusion, stoichiometry, time, reactivity and concentration.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

What is claimed is:

1. A method of forming an electroluminescent device, comprising the steps of:
   forming a first charge carrier injecting layer for injecting charge carriers of a first polarity;
   forming an organic charge carrier transport layer over the first charge carrier injecting layer, the transport layer having an electronic property and/or an optical property which varies across the thickness of the transport layer;
   forming an organic light emissive layer over the transport layer; and
   forming a second charge carrier injecting layer over the light emissive layer for injecting charge carriers of a second polarity.

2. A method as claimed in claim 1, wherein the step of forming a transport layer comprises the steps of depositing the transport layer and processing the transport layer to create the spatial variation in the said electronic and/or optical property.

3. A method as claimed in claim 2, wherein the transport layer comprises a conjugated material and the step of creating the variation in the electronic property and/or optical property comprises reducing the degree of conjugation of the conjugated material.

4. method as claimed in claim 2, wherein the step of processing the transport layer comprises exposing the transport layer to a reactive agent to promote a chemical reaction in the transport layer.

5. A method as claimed in claim 4, wherein the reaction is an oxidation reaction or reduction reaction.

6. A method as claimed in claim 4, wherein the reactive agent is an oxidising agent.

7. A method as claimed in claim 4, wherein the reactive agent is oxygen.

8. A method as claimed in claim 4, wherein the reactive agent is in the form of a plasma.

9. A method as claimed in claim 1, wherein the step of forming a transport layer comprises depositing the transport layer in a state in which the said electronic property or optical property varies across its thickness.

10. A method as claimed in claim 9, comprising the step of depositing the transport layer by a self-assembly method.

11. A method as claimed in claim 1, comprising the step of depositing the transport layer in the form of a series of sub-layers.

12. A method as claimed in claim 1, comprising the step of depositing the transport layer in the form of a series of bilayers each bilayer containing two sub-layers of different materials.

13. A method as claimed in claim 1, comprising the step of depositing the transport layer so as to comprise a series of sub-layers of a material wherein each sub-layer differs in electronic property and/or optical property.

14. A method as claimed in claim 13, wherein the said sub-layers of a material are graded in the said property across the thickness of the transport layer.

15. method as claimed in claim 13, wherein the said material comprises poly(styrenesulphonic acid).

16. A method as claimed in claim 15, wherein in at least some of the sub-layers the poly(styrenesulphonic acid) is doped with poly(ethylenedioxythiophene).

17. A method as claimed in claim 13, comprising the step of doping the sub-layers so as to achieve the difference in the electronic property and/or optical property.

18. A method as claimed in claim 1, wherein the electronic property is an energy level or energy level distribution.

19. A method as claimed in claim 18, wherein the electronic property is ionisation potential.

20. A method as claimed in claim 1, wherein in a direction from the first charge carrier injecting layer to the light emissive layer the ionisation potential of the transport layer varies away from the conduction band of the first charge carrier injecting layer.

21. A method as claimed in claim 1, wherein the charge carriers of a first polarity are positive charge carriers.

22. A method as claimed in claim 1, wherein in a direction from the first charge carrier injecting layer to the light emissive layer the ionisation potential varies towards the HOMO level of the light emissive layer.

23. A method as claimed in claim 1, wherein the transport layer comprises at least one of poly(styrenesulphonic acid) doped poly(ethylenedioxythiophene), BFA, polyaniline, and PPV.

24. A method of forming an electroluminescent device, comprising:
   forming a first charge carrier injecting layer for injecting positive charge carriers;
   forming an organic light emissive layer over the first charge carrier injecting layer, an electronic property and/or an optical property of the light emissive layer varying across the thickness of the emissive layer; and
   forming a second charge injecting layer over the light emissive layer for injecting negative charge carriers.

25. A method as claimed in claim 24, wherein the step of forming a light emissive layer comprises the steps of depositing the emissive layer and processing the emissive layer to create the variation in the electronic property and/or optical property across the thickness of the emissive layer.

26. A method as claimed in claim 25, wherein the step of processing the emissive layer comprises exposing the emissive layer to a reactive agent to promote a chemical reaction in the emissive layer.

27. A method as claimed in claim 26, wherein the reaction is an oxidation reaction or a reduction reaction.

28. A method as claimed in claim 26, wherein the reactive agent is an oxidising agent.

29. A method as claimed in claim 26, wherein the reactive agent is oxygen.

30. A method as claimed in claim 26, wherein the reactive agent is in the form of a plasma.

31. A method as claimed in claim 25, wherein the emissive layer comprises a conjugated material and the step of creating the variation in the electronic property and/or optical property comprises reducing the degree of conjugation of the conjugated material.

32. A method as claimed in claim 25, wherein the light emissive layer has an optical gap that varies in a direction from the first charge carrier injecting layer to the second charge carrier injecting layer.

33. A method of forming an electroluminescent device comprising a first charge carrier injecting layer for injecting charge carriers of a first polarity, a second charge carrier injecting layer for injecting charge carriers of a second polarity and at least one organic layer located between the charge carrier injecting layers, the method comprising the step of at least partially oxidizing or reducing the organic layer.

34. A method as claimed in claim 33, wherein the oxidation or reduction provides a variation in an electronic property or optical property across the thickness of the organic layer.

35. A method as claimed in claim 33, wherein the organic layer is a charge transport layer.

36. A method as claimed in claim 33, wherein the organic layer is a light emissive layer.

37. A method as claimed in claim 33, wherein the step of oxidizing or reducing the organic layer comprises exposing the organic layer to an oxidising agent or a reducing agent.

38. A method as claimed in claim 37, wherein the oxidising agent or reducing agent is a reactive oxidizing agent or reducing agent.

39. A method as claimed in claim 38, wherein the oxidizing agent or reducing agent is an oxygen plasma.

40. A method as claimed in claim 33, wherein the step of oxidizing or reducing the organic layer comprises exposing the organic layer to light to perform a photo-oxidization process.

41. A method as claimed in claim 37, wherein the step of exposing comprises exposing a major surface of the organic layer.

42. A method as claimed in claim 33, wherein the step of oxidizing or-reducing the organic layer comprises creating a gradation of oxidation through at least part of the thickness of the layer.

43. A method as claimed in claim 42, wherein the gradation of oxidation results in a gradation of an electronic property and/or optical property.

44. A method as claimed in claim 43, wherein the property is an ionisation potential.

45. An electroluminescent device comprising:

a first charge carrier injecting layer for injecting positive charge carriers;

a second charge carrier injecting layer for injecting negative charge carriers;

an organic light emissive layer located between the charge carrier injecting layers; and an organic charge carrier transport layer located between the light emissive layer and one of the charge carrier injecting layers, and comprising an organic material having an electronic property and/or an optical property which varies across the thickness of the transport layer.

46. An electroluminescent device as claimed in claim 45, wherein the electronic property and/or optical property is an energy level or energy level distribution responsible for transport of charge carriers.

47. An electroluminescent device as claimed in claim 45, wherein the electronic property and/or optical property is an ionisation level.

48. An electroluminescent device as claimed in claim 45, comprising a second organic charge carrier transport layer located between the light emissive layer and the other of the charge carrier injecting layers.

49. An electroluminescent device as claimed in claim 48, wherein the second organic charge carrier transport layer comprises an organic material having an ionisation potential for accepting positive charge carriers from the said other of the charge carrier injecting layers, which varies across the thickness of the second transport layer.

50. An electroluminescent device as claimed in claim 48, wherein the second organic charge carrier transport layer comprises an organic material having an electron affinity for accepting negative charge carriers from the said other of the charge carrier injecting layers, which varies across the thickness of the second transport layer.

* * * * *